United States Patent
Uhm et al.

(10) Patent No.: US 10,903,046 B2
(45) Date of Patent: *Jan. 26, 2021

(54) INDUCTIVE COIL STRUCTURE AND INDUCTIVELY COUPLED PLASMA GENERATION SYSTEM

(71) Applicant: EN2CORE technology, Inc., Daejeon (KR)

(72) Inventors: Sae Hoon Uhm, Gyeonggi-do (KR); Yun Seong Lee, Daejeon (KR)

(73) Assignee: EN2CORE technology, Inc., Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,679

(22) Filed: Dec. 4, 2019

(65) Prior Publication Data

US 2020/0105502 A1    Apr. 2, 2020

Related U.S. Application Data

(63) Continuation-in-part of application No. 15/836,388, filed on Dec. 8, 2017, now Pat. No. 10,541,114,
(Continued)

(30) Foreign Application Priority Data

Nov. 3, 2016    (KR) .......................... 10-2016-0146058

(51) Int. Cl.
*H01J 37/32*    (2006.01)
*C23C 16/50*    (2006.01)

(52) U.S. Cl.
CPC .......... *H01J 37/3211* (2013.01); *C23C 16/50* (2013.01); *H01J 2237/3321* (2013.01)

(58) Field of Classification Search
None
See application file for complete search history.

(56) References Cited

U.S. PATENT DOCUMENTS 5,607,542 A * 3/1997 Wu .................... H01J 37/32091
                                                 118/723 I
5,897,713 A * 4/1999 Tomioka ............... C23C 16/401
                                                 118/723 I
(Continued)

FOREIGN PATENT DOCUMENTS

JP    2006344998 A    12/2006
JP    5278148 B2    5/2013
(Continued)

OTHER PUBLICATIONS

KIPO, Korean Office Action for Application No. 10-2016-0146058 with English translation, dated Jul. 28, 2017. 15 pages.
(Continued)

*Primary Examiner* — Amy Cohen Johnson
*Assistant Examiner* — Srinivas Sathiraju
(74) *Attorney, Agent, or Firm* — Perkins Coie, LLP

(57) ABSTRACT

An inductively-coupled plasma (ICP) generation system may include a dielectric tube, a first inductive coil structure to enclose the dielectric tube, an RF power supply, a first main capacitor between a positive output terminal of the RF power supply and one end of the first inductive coil structure, and a second main capacitor between a negative output terminal of the RF power supply and an opposite end of the first inductive coil structure. The first inductive coil structure may include inductive coils connected in series to each other and placed at different layers, the inductive coils having at least one turn at each layer, and auxiliary capacitors, which
(Continued)

are respectively provided between adjacent ones of the inductive coils to distribute a voltage applied to the inductive coils.

20 Claims, 15 Drawing Sheets

Related U.S. Application Data which is a continuation of application No. PCT/KR2017/012040, filed on Oct. 30, 2017.

(56) References Cited

U.S. PATENT DOCUMENTS

| | | | | |
|---|---|---|---|---|
| 6,155,199 | A * | 12/2000 | Chen | H01J 37/32082 |
| | | | | 118/723 I |
| 6,164,241 | A * | 12/2000 | Chen | H01J 37/321 |
| | | | | 118/723 I |
| 6,414,648 | B1 * | 7/2002 | Holland | H01J 37/321 |
| | | | | 118/723 I |
| 6,463,875 | B1 * | 10/2002 | Chen | H01J 37/321 |
| | | | | 118/723 I |
| 6,495,963 | B1 * | 12/2002 | Bennett | H01J 37/321 |
| | | | | 118/723 E |
| 6,545,420 | B1 * | 4/2003 | Collins | C23C 16/509 |
| | | | | 118/723 ER |
| 7,355,357 | B2 * | 4/2008 | Park | F03H 1/00 |
| | | | | 315/501 |
| 7,413,673 | B2 * | 8/2008 | Lohokare | H01J 37/321 |
| | | | | 216/61 |
| 7,415,940 | B2 * | 8/2008 | Koshimizu | H01J 37/32082 |
| | | | | 118/723 E |
| 7,527,016 | B2 * | 5/2009 | Yamazawa | H01J 37/321 |
| | | | | 118/723 E |
| 7,648,611 | B2 * | 1/2010 | Laermer | H01J 37/321 |
| | | | | 118/723 I |
| 8,251,011 | B2 * | 8/2012 | Yamazawa | H01J 37/32174 |
| | | | | 118/723 E |
| 8,314,560 | B2 * | 11/2012 | Nakagami | H01J 37/32174 |
| | | | | 315/111.21 |
| 8,502,455 | B2 * | 8/2013 | Kanda | H01J 37/321 |
| | | | | 315/111.21 |
| 8,742,669 | B2 * | 6/2014 | Carter | H01J 37/321 |
| | | | | 315/111.51 |
| 9,293,299 | B2 * | 3/2016 | Yamazawa | H01J 37/321 |
| 9,583,313 | B2 * | 2/2017 | Okumura | H01J 37/32935 |
| 9,627,181 | B2 * | 4/2017 | Yamazawa | H01J 37/3211 |
| 9,685,297 | B2 * | 6/2017 | Carter | H01J 37/32944 |
| 9,842,725 | B2 * | 12/2017 | Valcore, Jr. | H01J 37/32183 |
| 9,875,881 | B2 * | 1/2018 | Nagami | H01J 37/32091 |
| 9,953,811 | B2 * | 4/2018 | Yamazawa | H01J 37/321 |
| 9,966,236 | B2 * | 5/2018 | Long | H01J 37/32651 |
| 9,997,332 | B2 * | 6/2018 | Yamazawa | H01J 37/321 |
| 10,541,114 | B2 * | 1/2020 | Uhm | H01J 37/321 |
| 2002/0004309 | A1 * | 1/2002 | Collins | H01J 37/3266 |
| | | | | 438/719 |
| 2015/0221477 | A1 * | 8/2015 | Maeda | C23C 16/507 |
| | | | | 438/798 |
| 2015/0243486 | A1 * | 8/2015 | Yokogawa | H01J 37/32165 |
| | | | | 156/345.28 |
| 2018/0047542 | A1 * | 2/2018 | Nguyen | H01J 37/321 |
| 2018/0122619 | A1 * | 5/2018 | Uhm | H01J 37/321 |
| 2020/0105502 | A1 * | 4/2020 | Uhm | C23C 16/50 |
| 2020/0111641 | A1 * | 4/2020 | Uhm | H05H 1/46 |

FOREIGN PATENT DOCUMENTS

| | | |
|---|---|---|
| JP | 2015026464 A | 2/2015 |
| JP | 5923228 B2 | 4/2016 |
| KR | 10-1094919 B1 | 12/2011 |

OTHER PUBLICATIONS

KIPO, Korean Notice of Allowance for Application No. 10-2016-0146058 with English translation, dated Jan. 4, 2018. 2 pages.

KIPO, International Search Report and Written Opinion for International Patent Application No. PCT/KR2017/12040 with English translation, dated Mar. 2, 2018. 27 pages.

USPTO, Non-Final Office Action for U.S. Appl. No. 15/836,388, dated Oct. 18, 2018. 14 pages.

USPTO, Final Office Action for U.S. Appl. No. 15/836,388, dated May 24, 2019. 12 pages.

USPTO, Notice of Allowance for U.S. Appl. No. 15/836,388, dated Sep. 4, 2019. 8 pages.

USPTO, Non-Final Office Action for U.S. Appl. No. 16/703,618, dated Jun. 26, 2020. 21 pages.

* cited by examiner

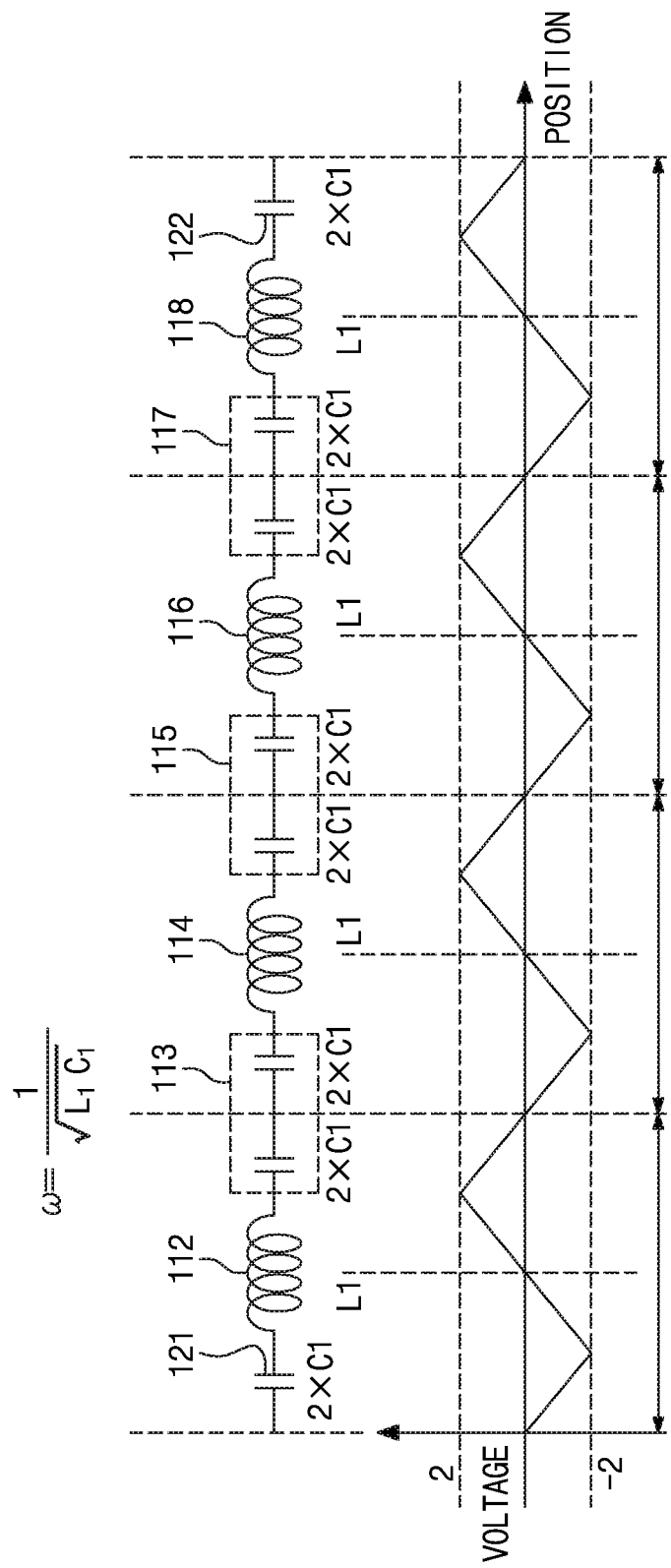

INDUCTIVE COIL STRUCTURE AND INDUCTIVELY COUPLED PLASMA GENERATION SYSTEM

CROSS-REFERENCE TO RELATED APPLICATIONS

This application is a continuation of U.S. patent application Ser. No. 15/836,388, filed on Dec. 8, 2017, which is a continuation of and claims priority to PCT/KR2017/012040 filed on Oct. 30, 2017, which claims priority to Korea Patent Application No. 10-2016-0146058 filed on Nov. 3, 2016, the entireties of which are both hereby incorporated by reference.

BACKGROUND

The present disclosure relates to an inductively-coupled plasma (ICP) generation system, and in particular, to an ICP generation system including a capacitor interposed between a plurality of antennas and having a voltage division structure.

Plasma is used for a process of etching a substrate (e.g., a semiconductor wafer) or of depositing a layer the substrate. Furthermore, the plasma is used for synthesis of new materials, surface treatment, and environment purification. In addition, an atmospheric pressure plasma is used for plasma scrubber, cleaning, sterilization, and skin care.

To generate a conventional inductively-coupled plasma (ICP), a dielectric discharge tube wound by an inductive coil is used. However, the conventional inductive coil structure suffers from low discharge stability and a low plasma density.

The present invention provides a novel inductive coil structure, which is configured to stably generate inductively-coupled plasma at an atmospheric pressure or a high pressure of several Torr or higher.

SUMMARY

Some embodiments of the inventive concept provide an inductive coil structure, which is used to produce inductively-coupled plasma with improved discharge stability and efficiency while suppressing capacitive-coupling components.

Some embodiments of the inventive concept provide an inductive coil structure, which is configured to prevent a voltage increase caused by an increase in the winding number of an inductive coil, and a plasma generation system including the same.

Some embodiments of the inventive concept provide an inductive coil structure, which is configured to maximally increase the number of windings per unit length and to suppress capacitive coupling.

According to some embodiments of the inventive concept, an inductively-coupled plasma (ICP) generation system may include a dielectric tube extending in a length direction, a first inductive coil structure provided to enclose the dielectric tube and to produce ICP in the dielectric tube, an RF power supply configured to provide positive and negative powers having opposite phases, to respectively supply positive and negative powers of RF power to both ends of the first inductive coil structure, and to change a driving frequency, a first main capacitor provided between a positive output terminal of the RF power supply and one end of the first inductive coil structure, and a second main capacitor provided between a negative output terminal of the RF power supply and an opposite end of the first inductive coil structure. The first inductive coil structure may include inductive coils connected in series to each other and placed at different layers, the inductive coils having at least one turn at each layer, and auxiliary capacitors, which are respectively provided between adjacent ones of the inductive coils to distribute a voltage applied to the inductive coils.

In some embodiments, each of the inductive coils may have the same inductance of first inductance L1, each of the auxiliary capacitors may have the same capacitance of first capacitance C1, and a driving frequency of the RF power may be controlled to coincide with a resonance frequency, which is determined by the first inductance L1 and the first capacitance C1 connected in series to each other.

In some embodiments, each of the first main capacitor and the second main capacitor may have the same capacitance of second capacitance C2, and the second capacitance C2 may be two times the first capacitance C1.

In some embodiments, each of the inductive coils may be a 2- to 4-turn antenna.

In some embodiments, the ICP generation system may further include a second inductive coil structure provided to enclose the dielectric tube, to produce ICP in the dielectric tube, and to have the same structure as the first inductive coil structure, the second inductive coil structure being spaced apart from the first inductive coil structure. One end of the second inductive coil structure may be connected to one end of the first inductive coil structure, an opposite end of the second inductive coil structure may be connected to an opposite end of the first inductive coil structure, and the first inductive coil structure and the second inductive coil structure may be connected in parallel to each other between the first main capacitor and the second main capacitor.

In some embodiments, each of the inductive coils constituting the first inductive coil structure and the second inductive coil structure may have the same inductance of first inductance L1, each of the auxiliary capacitors constituting the first inductive coil structure and the second inductive coil structure may have the same capacitance of first capacitance Cl, and a driving frequency of the RF power may be controlled to coincide with a resonance frequency, which is determined by the first inductance L1 and the first capacitance C1 connected in series to each other.

In some embodiments, each of the first main capacitor and the second main capacitor may have the same capacitance of second capacitance C2, and the second capacitance C2 may be four times the first capacitance C1.

In some embodiments, the one end of the first inductive coil structure and the one end of the second inductive coil structure may be placed to be adjacent to each other, and the one end of the first inductive coil structure and the one end of the second inductive coil structure may be connected to each other and may be connected to the first main capacitor.

In some embodiments, each of the inductive coils may include a first circular arc portion, which has a portion opened in a first direction in a rectangular coordinate system and is provided on an arrangement plane to have a first central angle and a constant first radius, a second circular arc portion, which is provided on the arrangement plane to have a second central angle less than the first central angle, to have a second radius larger than the first radius, and to have the same center axis as a center axis of the first circular arc portion, a first connecting portion, which is provided on the arrangement plane to be connected to one end of the first circular arc portion and to extend in the first direction, a "U"-shaped first circular arc connecting portion, which is provided on the arrangement plane to connect an opposite end of the first circular arc portion with one end of the second circular arc portion, and a second connecting portion, which is provided on the arrangement plane to be connected to an opposite end of the second circular arc portion and to extend in the first direction.

In some embodiments, each of the inductive coils may include a first circular arc portion, which has a portion opened in a first direction in a rectangular coordinate system and is provided on an arrangement plane to have a first central angle and a constant first radius, a second circular arc portion, which is provided on the arrangement plane to have a second central angle less than the first central angle, to have a second radius larger than the first radius, and to have the same center axis as a center axis of the first circular arc portion, a third circular arc portion, which is provided on the arrangement plane to have a third central angle less than the second central angle, to have a third radius larger than the second radius, and to have the same center axis as the center axis of the first circular arc portion, a first connecting portion, which is provided on the arrangement plane to be connected to one end of the first circular arc portion and to extend in the first direction, a "U"-shaped first circular arc connecting portion, which is provided on the arrangement plane to connect an opposite end of the first circular arc portion with one end of the second circular arc portion, a "U"-shaped second circular arc connecting portion, which is provided on the arrangement plane to connect an opposite end of the second circular arc portion to one end of the third circular arc portion, and a second connecting portion, which is provided on the arrangement plane to be connected to an opposite end of the third circular arc portion and to extend in the first direction.

In some embodiments, each of the inductive coils may include a first circular arc portion, which has a portion opened in a first direction in a rectangular coordinate system and is provided on an arrangement plane to have a first central angle and a constant first radius, a second circular arc portion, which is provided on the arrangement plane to have a second central angle less than the first central angle, to have a second radius larger than the first radius, and to have the same center axis as a center axis of the first circular arc portion, a third circular arc portion, which is provided on the arrangement plane to have a third central angle less than the second central angle, to have a third radius larger than the second radius, and to have the same center axis as the center axis of the first circular arc portion, a fourth circular arc portion, which is provided on the arrangement plane to have a fourth central angle less than the third central angle, to have a fourth radius larger than the third radius, and to have the same center axis as the center axis of the first circular arc portion, a first connecting portion, which is provided on the arrangement plane to be connected to one end of the first circular arc portion and to extend in the first direction, a "U"-shaped first circular arc connecting portion, which is provided on the arrangement plane to connect an opposite end of the first circular arc portion with one end of the second circular arc portion, a "U"-shaped second circular arc connecting portion, which is provided on the arrangement plane to connect an opposite end of the second circular arc portion to one end of the third circular arc portion, a "U"-shaped third circular arc connecting portion, which is provided on the arrangement plane to connect an opposite end of the third circular arc portion to one end of the fourth circular arc portion, and a second connecting portion, which is provided on the arrangement plane to be connected to an opposite end of the fourth circular arc portion and to extend in the first direction.

In some embodiments, the first inductive coil structure and the second inductive coil structure may be provided to have a vertical mirror symmetry with reference to a point of the dielectric discharge tube, and current may be vertically divided at a center and then may be collected at both ends.

In some embodiments, power input terminals of the inductive coils may be arranged to maintain a uniform angle in an azimuth direction.

In some embodiments, at least a portion of the inductive coils may be fixed by a ceramic mold.

In some embodiments, the ICP generation system may further include a washer-shaped insulating spacer, which is provided between the inductive coils to electrically disconnect the inductive coils from each other.

In some embodiments, the inductive coils may include first to fourth inductive coils sequentially stacked, and the auxiliary capacitor may include first to third auxiliary capacitors. When compared with the first inductive coil, the second inductive coil may be rotated counterclockwise by 90° and may be placed below and aligned with the first inductive coil. When compared with the second inductive coil, the third inductive coil may be rotated counterclockwise by 90° and may be placed below and aligned with the second inductive coil. When compared with the third inductive coil, the fourth inductive coil may be rotated counterclockwise by 90° and may be placed below and aligned with the third inductive coil. One end of the first inductive coil may be connected to a positive output terminal of the RF power supply through the first main capacitor, an opposite end of the first inductive coil may be connected to one end of the second inductive coil through the first auxiliary capacitor, an opposite end of the second inductive coil may be connected to one end of the third inductive coil through the second auxiliary capacitor, an opposite end of the third inductive coil may be connected to one end of the fourth inductive coil through the third auxiliary capacitor, and an opposite end of the fourth inductive coil may be connected to a negative output terminal of the RF power supply through the second main capacitor.

According to some embodiments of the inventive concept, a substrate processing system may include a process chamber configured to process a semiconductor substrate, and an ICP generation system configured to provide active species, which are provided by plasma, into the process chamber. The ICP generation system may include a dielectric tube extending in a length direction, a first inductive coil structure provided to enclose the dielectric tube and to produce ICP in the dielectric tube, an RF power supply configured to provide positive and negative powers having opposite phases, to respectively supply positive and negative powers of RF power to both ends of the first inductive coil structure, and to change a driving frequency, a first main capacitor provided between a positive output terminal of the RF power supply and one end of the first inductive coil structure, and a second main capacitor provided between a negative output terminal of the RF power supply and an opposite end of the first inductive coil structure. The first inductive coil structure may include inductive coils connected in series to each other and placed at different layers, the inductive coils having at least one turn at each layer, and auxiliary capacitors, which are respectively provided between adjacent ones of the inductive coils to distribute a voltage applied to the inductive coils.

According to some embodiments of the inventive concept, an inductive coil structure may be provided to enclose a dielectric tube and to produce ICP in the dielectric tube. The inductive coil structure may include inductive coils connected in series to each other and placed at different layers, the inductive coils having at least one turn at each layer and having the same structure, and auxiliary capacitors, which are respectively provided between adjacent ones of the inductive coils to distribute a voltage applied to the inductive coils.

In some embodiments, each of the inductive coils may include a first circular arc portion, which has a portion opened in a first direction in a rectangular coordinate system and may be provided on an arrangement plane to have a first central angle and a constant first radius, a second circular arc portion, which is provided on the arrangement plane to have a second central angle less than the first central angle, to have a second radius larger than the first radius, and to have the same center axis as a center axis of the first circular arc portion, a third circular arc portion, which is provided on the arrangement plane to have a third central angle less than the second central angle, to have a third radius larger than the second radius, and to have the same center axis as the center axis of the first circular arc portion, a first connecting portion, which is provided on the arrangement plane to be connected to one end of the first circular arc portion and to extend in the first direction, a "U"-shaped first circular arc connecting portion, which is provided on the arrangement plane to connect an opposite end of the first circular arc portion with one end of the second circular arc portion, a "U"-shaped second circular arc connecting portion, which is provided on the arrangement plane to connect an opposite end of the second circular arc portion to one end of the third circular arc portion, a second connecting portion, which is provided on the arrangement plane to be connected to an opposite end of the third circular arc portion and to extend in the first direction.

In some embodiments, each of the inductive coils may include a first circular arc portion, which has a portion opened in a first direction in a rectangular coordinate system and is provided on an arrangement plane to have a first central angle and a constant first radius, a second circular arc portion, which is provided on the arrangement plane to have a second central angle less than the first central angle, to have a second radius larger than the first radius, and to have the same center axis as a center axis of the first circular arc portion, a third circular arc portion, which is provided on the arrangement plane to have a third central angle less than the second central angle, to have a third radius larger than the second radius, and to have the same center axis as the center axis of the first circular arc portion, a fourth circular arc portion, which is provided on the arrangement plane to have a fourth central angle less than the third central angle, to have a fourth radius larger than the third radius, and to have the same center axis as the center axis of the first circular arc portion, a first connecting portion, which is provided on the arrangement plane to be connected to one end of the first circular arc portion and to extend in the first direction, a "U"-shaped first circular arc connecting portion, which is provided on the arrangement plane to connect an opposite end of the first circular arc portion with one end of the second circular arc portion, a "U"-shaped second circular arc connecting portion, which is provided on the arrangement plane to connect an opposite end of the second circular arc portion to one end of the third circular arc portion, a "U"-shaped third circular arc connecting portion, which is provided on the arrangement plane to connect an opposite end of the third circular arc portion to one end of the fourth circular arc portion, and a second connecting portion, which is provided on the arrangement plane to be connected to an opposite end of the fourth circular arc portion and to extend in the first direction.

BRIEF DESCRIPTION OF THE DRAWINGS

Example embodiments will be more clearly understood from the following brief description taken in conjunction with the accompanying, example drawings. The accompanying drawings represent non-limiting, example embodiments as described herein.

FIG. 2C is a diagram illustrating voltage division in the ICP generation system of FIG. 2A.

Figure 1:
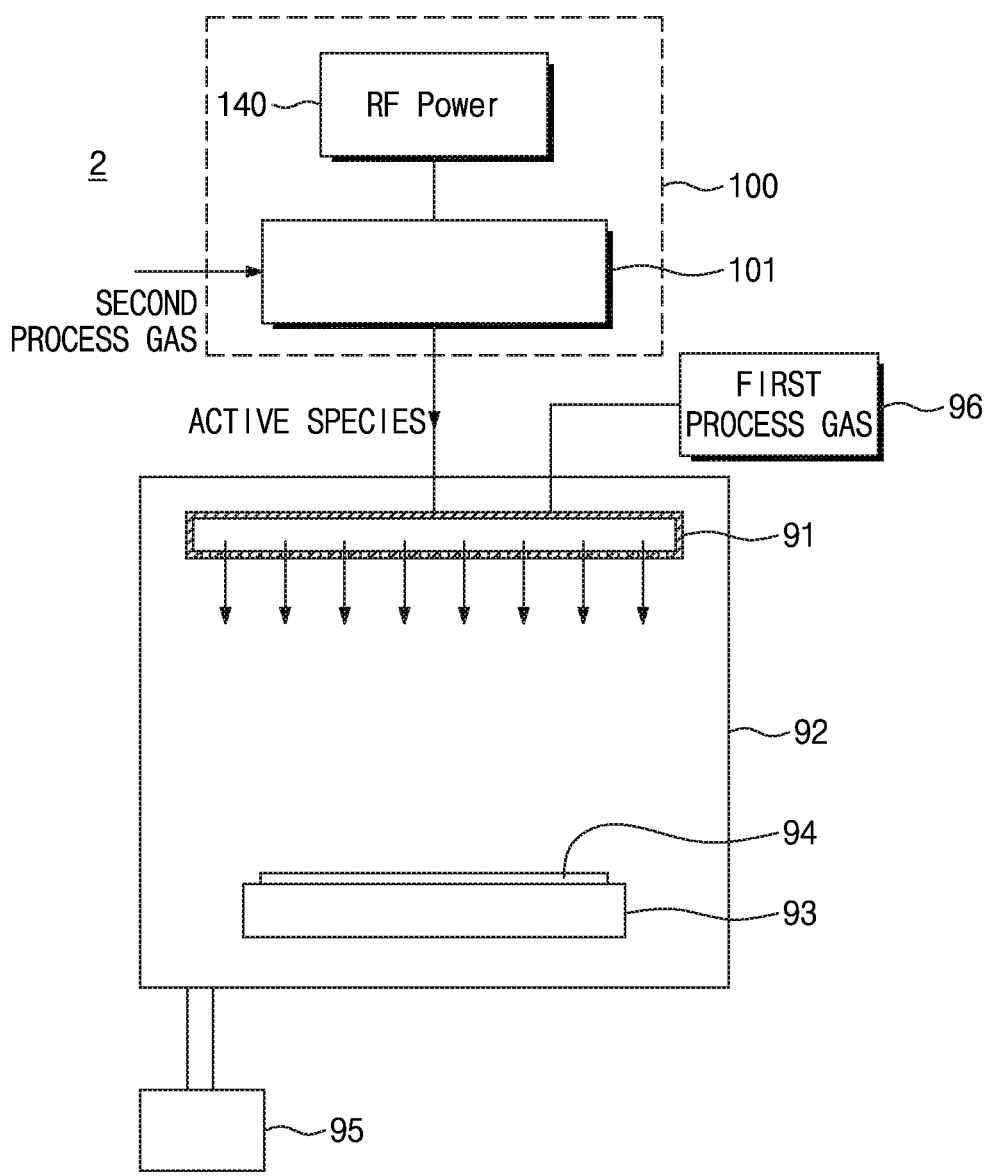
FIG. 1 is a conceptual diagram illustrating a semiconductor substrate processing system according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In an antenna provided to surround a dielectric discharge tube, high voltage electric potential (3 kV or higher) is applied in the dielectric discharge tube under the condition of low pressure (lower than several tens of Torr without fluid effects). In this case, plasma is generated in the dielectric discharge tube. A surface of the dielectric discharge tube is heated by collision of ions. Accordingly, the dielectric discharge tube is heated to a temperature of 1000° C. or higher. This may lead to a change in surface characteristics of the dielectric discharge tube or perforation of the dielectric discharge tube.

The high electric potential applied to the antenna is affected by inductance, frequency, and current of the antenna. In the high power condition, a high electric potential is necessarily applied to the antenna. Thus, it is necessary to lower the high electric potential in the antenna.

According to some embodiments of the inventive concept, in the case where the high power of several kW or higher is applied, a method of lowering the applied high voltage and of minimizing a heating issue by ion collision is proposed.

The inductively-coupled plasma (ICP) system may be used for a semiconductor processing apparatus, an inductively coupled spectral analysis apparatus, an ion beam generating apparatus, an apparatus for cleaning a deposition chamber, an apparatus for cleaning an exhaust hole of a deposition chamber, a plasma scrubber for removing waste gas from a semiconductor processing apparatus, or a cleaning apparatus for cleaning a process chamber of a chemical vapor deposition system.

In some embodiments, an ICP generation system may be used as a remote plasma source providing active species into a semiconductor processing chamber.

An inductive coil generating the ICP and plasma may be modeled as a transformer circuit. Accordingly, the ICP is called "transformer coupled plasma". The inductive coil serves as a primary coil of the transformer circuit, and the plasma serves as a secondary coil of the transformer circuit. A magnetic flux confinement material such as a magnetic material may be used to increase a magnetic coupling between the inductive coil and the plasma. However, it is difficult to apply the magnetic flux confinement material to a cylindrical dielectric discharge container. Another method for enhancing the magnetic coupling between the inductive coil and the plasma is to increase inductance or winding number of inductive coil. However, the increase in inductance of the inductive coil increases impedance and makes it difficult to transmit the power efficiently. In addition, the increase in inductance of the inductive coil may increase voltage to be applied to the inductive coil, thereby causing parasitic arc discharge. Also, high voltage applied to the inductive coil may lead to capacitively-coupled discharge and the damage of the dielectric discharge container by ion collision and heat.

According to some embodiments of the inventive concept, a capacitor may be provided between series-connected inductive coils, and this makes it possible to reduce the voltage applied to the inductive coil and allows the overall voltage to be distributed between the inductive coil and the capacitor. In detail, the inductive coil may be divided into a plurality of inductive coils, auxiliary capacitors may be provided between the divided inductive coils, and main capacitors may be provided at both ends of the inductive coil. In this case, the electrostatic field may be reduced by the screening effect, and according to the voltage distribution model, the voltage applied to the inductive coil may be reduced. The divided inductive coils and the auxiliary capacitors therebetween may constitute a series resonant circuit, and the resonance circuit may be configured to have the same resonance frequency as the driving frequency of the AC power supply. Accordingly, even when a low voltage is applied to the inductive coil, the impedance matching operation can be performed stably.

Inductively coupled plasma is generated using a driving frequency of several MHz, typically at a pressure of hundreds of mTorr. However, since the inductive electric field is weak, it is difficult to use the ICP for the discharge at atmospheric pressure or at high pressure of several Torr or higher. Accordingly, it is necessary to sufficiently increase the strength of the induced electric field and to provide an additional component for an initial discharge.

In the case where an ICP discharge is performed by applying RF power to the inductive coil surrounding the dielectric tube, the dielectric tube may be heated and damaged by the ICP. That is, the ICP has a structural limitation at high power of several tens of kWatt or higher.

In some embodiments, in order to improve the efficiency or stability of conventional ICPs, 1) an antenna (or a coil structure) is provided in a stacked form, thereby increasing an intensity of an inductive electric field, 2) an inductive coil is divided into a plurality of inductive coils and a capacitor for reducing impedance is disposed between the inductive coils, 3) main capacitors are connected to both ends of the inductive coil to satisfy the overall resonance condition, and 4) a frequency-varying AC power part is provided to improve plasma stability of the inductive coil. Thus, it is possible to perform a process at a flow rate of several tens to several hundreds of liters per minute and at a high pressure of several Torr or higher, which cannot be realized by the conventional ICP generation system. In addition, there is no need for an additional electrode for the initial discharge, and the initially discharge may be performed even when the driving frequency of the AC power part does not satisfy the resonance condition. In the case where the resonance condition is not satisfied, high voltage is applied to the inductive coil to perform the initial discharge, and then, a main discharge is performed by changing the driving frequency of the AC power part to the resonance condition.

The terms "inductive coil" and "antenna" are used interchangeably in the following. For an ICP antenna, an intensity of inductive electric field transmitted to the plasma is proportional to a current and frequency of the inductive coil and proportional to square of a winding number. Therefore, by increasing the winding number of the inductive coil or antenna, it may be possible to apply a strong electric field to the plasma. However, if the winding number of a solenoid coil increases, energy is dispersed in a length direction of the dielectric discharge tube, due to spatial constraint. In addition, the high inductance (impedance) of the inductive coil makes it difficult to transfer power from the RF power generator to the inductive coil or the antenna.

It is necessary to increase the density of the electric field near the plasma, and thus, it is necessary to maximize the number of windings per unit length in the length direction of the dielectric discharge tube. In the case where a high voltage is applied to the inductive coil, the inductive coil generates a capacitively coupled plasma reducing stability of the discharge. The capacitively coupled plasma is advantageous for the initial discharge, but since it causes ion acceleration, a dielectric tube or a dielectric window, through which an inductive electric field is transmitted, may be damaged.

In some embodiments, to solve the damage problem of the dielectric discharge tube due to the high voltage applied to the antenna, capacitors may be interposed between antennas placed in each layer. Thus, even if more power is applied to the antenna, the dielectric discharge tube may not be damaged. The capacitor may be used between the unit antennas to lower a voltage applied to the antenna. In addition, it may be possible to suppress a parasitic discharge, owing to a high voltage between the antenna and a power input terminal and between the antenna and a power output terminal.

If the high voltage is applied to the antenna, it may lead to acceleration and collision of ions, and the surface may be heated to high temperature and may be damaged. Owing to these problems, it is difficult to apply the high power condition to the ICP, and alternatively, methods of reducing inductance or spacing the antenna away from the tube are used.

In some embodiments, in the case where capacitors are placed in series between the unit antennas constituting the antenna, the highest electric potential may be reduced in inverse proportion to the division number of the unit antennas, and the damage of the dielectric discharge tube may be reduced even at high power.

According to a comparative example, antennas with the same inductance were tested. The capacitor was not applied to one of the antennas, but in the other of the antennas, the capacitor was placed in series between the unit antennas constituting the antenna. For the conventional antenna, the dielectric discharge tube was damaged at the power of 2 kW. However, for the case according to the inventive concept, the dielectric discharge tube was not damaged even at the power of 8 kW and provided improved discharge characteristics. In detail, for the conventional antenna, N2 gas could not be injected at the power of 4 kW or lower, but for the improved antenna, it was possible to inject from the power of 1.5 kW.

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

FIG. 1 is a conceptual diagram illustrating a semiconductor substrate processing system according to example embodiments of the inventive concept.

Referring to FIG. 1, a semiconductor substrate processing system 2 may include a process chamber 92, which is used to process a substrate 94, and an ICP generation system 100, which is configured to provide active species produced by an inductively-coupled plasma into the process chamber.

The process chamber 92 may be configured to deposit a thin film (e.g., a tungsten layer) on the substrate 94. The process chamber 92 may be configured to receive a first process gas (e.g., WF6) and the active species (e.g., hydrogen active species) from the ICP generation system 100. The active species may be produced from hydrogen (H2) plasma. The process chamber 92 may include a gas distributing part 91. The gas distributing part 91 may be configured to receive the first process gas from a process gas supplying part 96 and the active species from the ICP generation system 100. To uniformly deposit a thin film on the substrate, the gas distributing part 91 may spatially distribute the gas supplied thereto.

The ICP generation system 100 may be a remote plasma source. The ICP generation system 100 may be configured to produce hydrogen plasma with high efficiency, under a high pressure of several Torr. The ICP generation system 100 may include an inductive discharge module 191 and an RF power supply 140, which is configured to supply an electric power to the inductive discharge module 101. The ICP generation system 100 may be configured to receive a second process gas, to produce active species from the second process gas using ICP, and to provide the active species to the process chamber 92.

A substrate holder 93 may be provided in the process chamber 92 to face and be parallel to the gas distributing part 91, and the substrate 94 may be provided on the substrate holder 93 and in the process chamber 92. The substrate holder 93 may be heated, for a chemical vapor deposition process. The substrate 94 may be a semiconductor substrate. In detail, the substrate may be a silicon wafer. A vacuum pump 95 may be provided to exhaust gas from the process chamber 92.

In certain embodiments, the active species may be directly supplied to the process chamber 92, not through the gas distributing part 91.

In certain embodiments, the semiconductor substrate processing system 2 is not limited to be used for the chemical vapor deposition process, and the semiconductor substrate processing system 2 may be used to perform various processes.

In certain embodiments, the ICP generation system 100 is not limited to be used for the chemical vapor deposition process and may be used for a process of cleaning the process chamber 92. For example, the semiconductor substrate processing system 2 may include an additional remote plasma source, which is configured to discharge NF3 and to perform a cleaning process on the process chamber 92. In this case, since fluorine leads to a change in process environment of the process chamber 92, the ICP generation system 100 may provide the hydrogen active species to the process chamber 92. Accordingly, fluorine adsorbed on an inner surface of the process chamber 92 may be reacted with the hydrogen active species and may be removed.

Figure 2A:
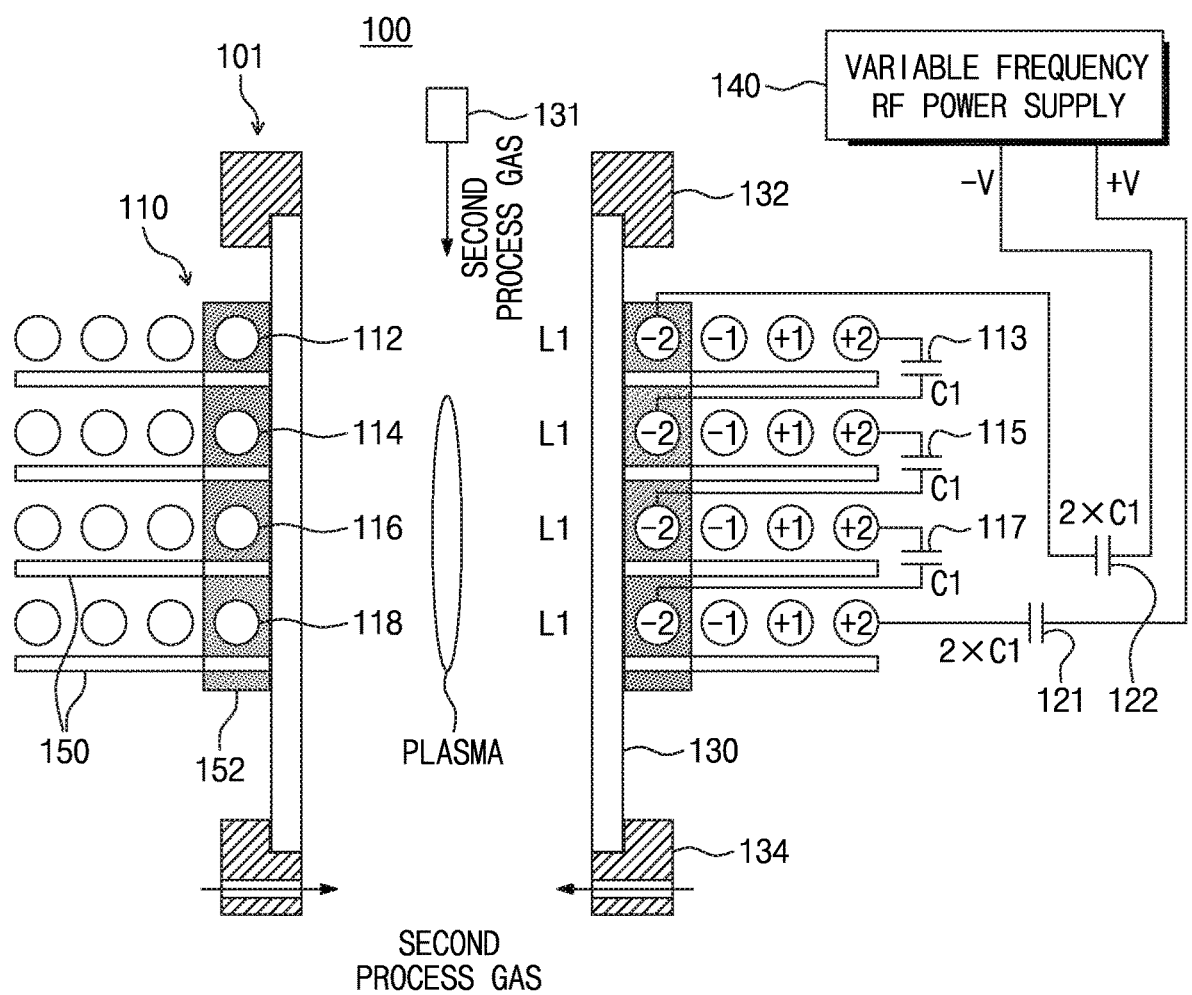
FIG. 2A is a conceptual diagram illustrating an ICP generation system according to example embodiments of the inventive concept.

FIG. 2A is a conceptual diagram illustrating an ICP generation system according to example embodiments of the inventive concept.

Figure 2B:
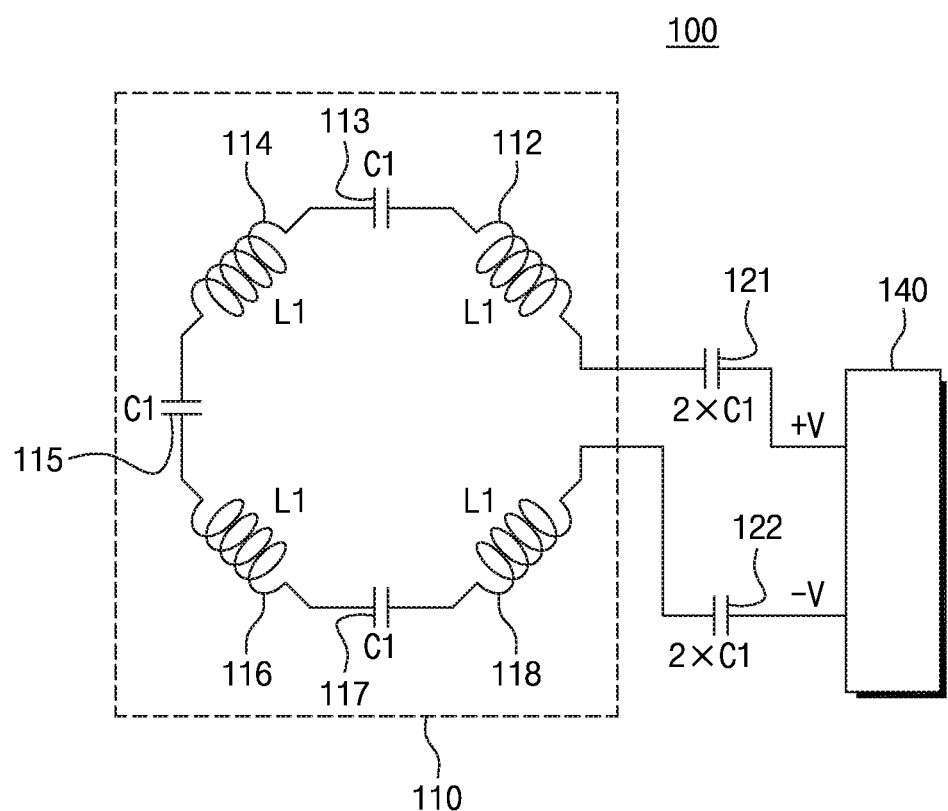
FIG. 2B is a circuit diagram illustrating the ICP generation system of FIG. 2A.

FIG. 2B is a circuit diagram illustrating the ICP generation system of FIG. 2A.

FIG. 2C is a diagram illustrating voltage division in the ICP generation system of FIG. 2A.

Figure 2D:
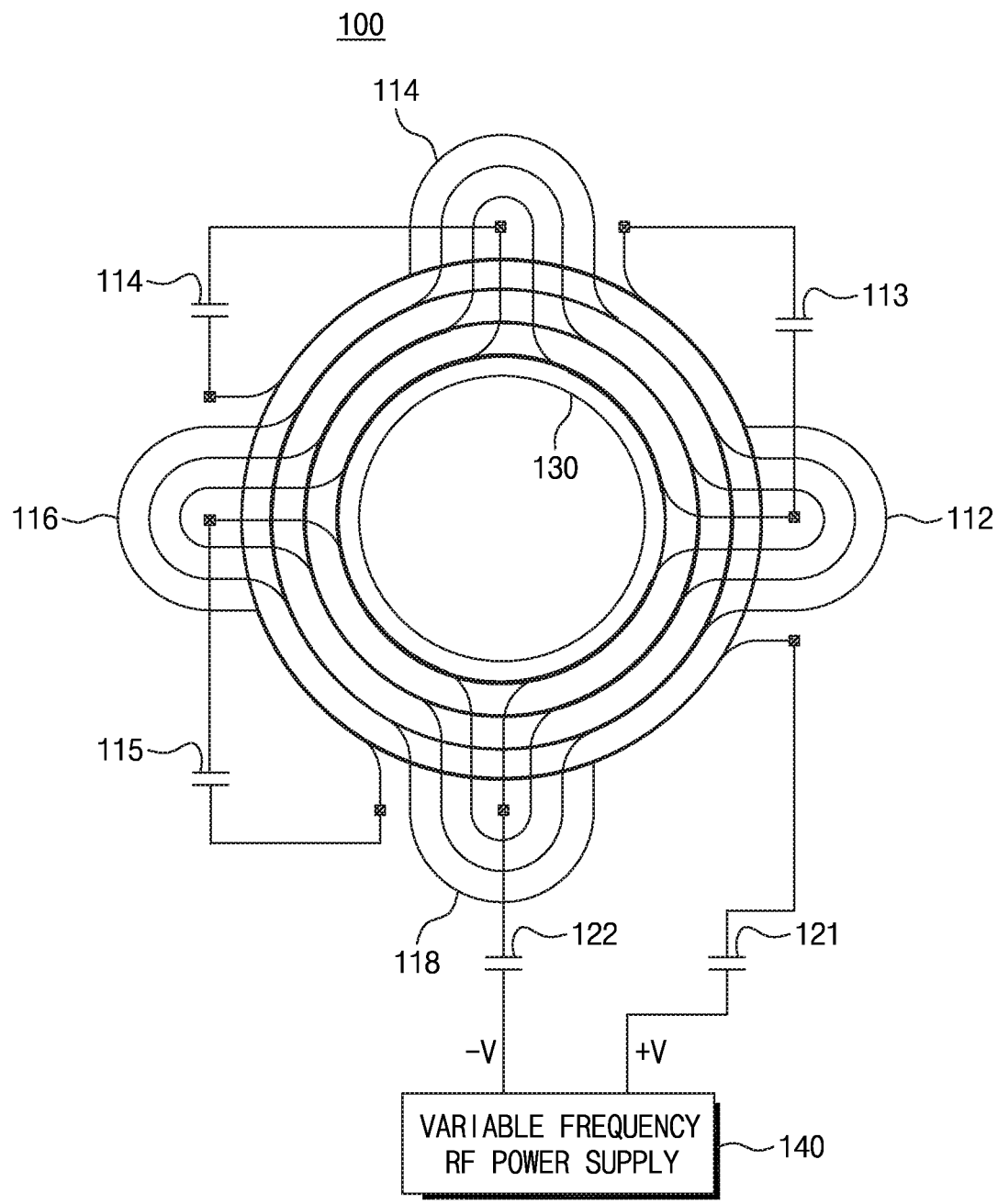
FIG. 2D is a plan view illustrating the ICP generation system of FIG. 2A.

FIG. 2D is a plan view illustrating the ICP generation system of FIG. 2A.

Figure 2E:
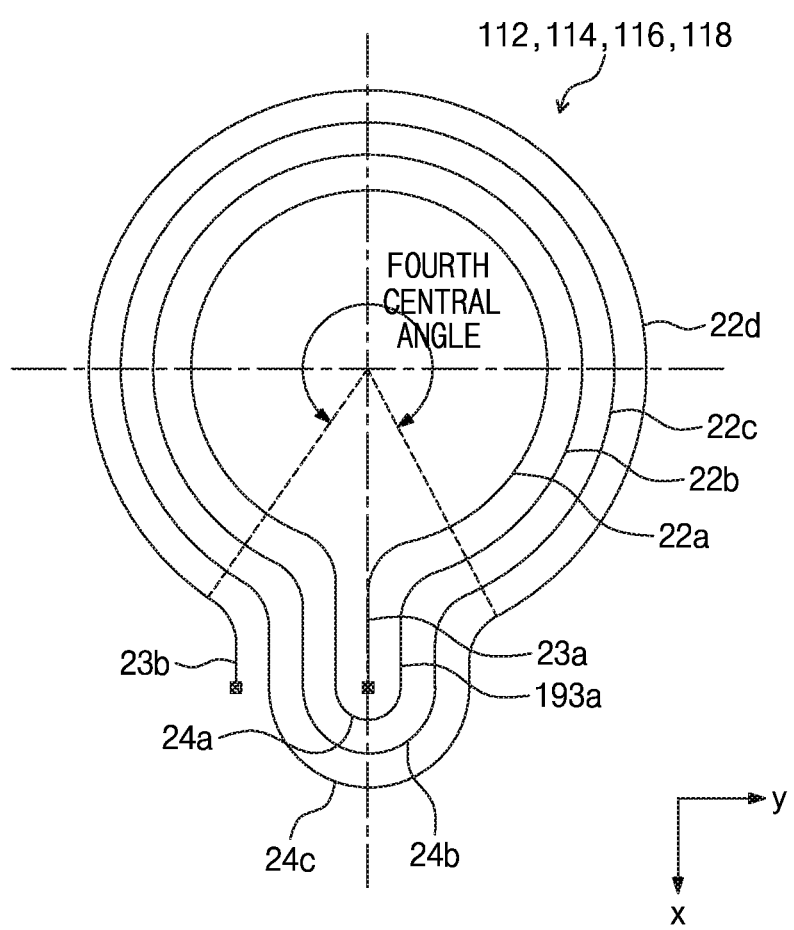
FIG. 2E is a plan view illustrating an inductive coil of the ICP generation system of FIG. 2A.

FIG. 2E is a plan view illustrating an inductive coil of the ICP generation system of FIG. 2A.

Referring to FIGS. 2A through 2E, the ICP generation system 100 may include a dielectric tube 130 extending in a length direction, a first inductive coil structure 110, which is provided to enclose the dielectric tube 130 and to produce ICP in the dielectric tube 130; an RF power supply 140, which is configured to provide positive and negative powers having opposite phases, to respectively supply positive and negative powers of RF power to both ends of the first inductive coil structure, and to change a driving frequency; a first main capacitor 121 provided between a positive output terminal of the RF power supply and one end of the first inductive coil structure; and a second main capacitor 122 provided between a negative output terminal of the RF power supply and an opposite end of the first inductive coil structure.

The first inductive coil structure 110 may include inductive coils 112, 114, 116, and 118, which are connected in series to each other and are placed at different layers, and auxiliary capacitors 113, 115, and 117, which are respectively provided between adjacent ones of the inductive coils to distribute a voltage applied to the inductive coils. The inductive coils 112, 114, 116, and 118 may be provided to have at least one turn at each layer.

The driving frequency of the RF power supply 140 may range from several hundreds of kHz to several MHz. An output power of the RF power supply 140 may range from several tens of watts to several tens of kW. The RF power supply 140 may supply an electric power to a time-varying load (ICP) through the first inductive coil structure. The inductive coil of the first inductive coil structure 110 may be electromagnetically coupled with the ICP. Accordingly, an apparatus for impedance matching between the RF power supply 140 and the first inductive coil structure 110 may be required. The RF power supply 140 may be configured to output a first output power and a second output power whose phases are opposite to each other. At a certain time, the first output power and the second output power may have opposite phases with respect to the ground.

A conventional impedance matching network may include two variable reactance devices (e.g., vacuum variable capacitors) or transformers for the impedance matching. In this case, the first inductive coil structure 110 may have a difficulty in stably meeting resonance condition with the driving frequency. Thus, a RF power with a variable driving frequency may be used to allow a pair of the inductive coil and the auxiliary capacitor, which are adjacent to each other in the first inductive coil structure, to meet a series resonance condition.

The dielectric tube 130 may have a cylindrical shape and may extend in a length direction. The dielectric tube 130 may be formed of a material (e.g., glass, quartz, ceramic, alumina, or sapphire) having a good heat-resistance property. An inner diameter of the dielectric tube 130 may be several tens of millimeters. A length of the dielectric tube 130 may be several tens of centimeters.

A cylindrical ICP generation system may include a cylindrical dielectric discharge tube and an antenna provided to surround the discharge tube. In the cylindrical ICP, an inductive electric field may not be vertically incident into the dielectric discharge tube, and thus, it may be possible to reduce damage caused by ion impact. The cylindrical ICP may produce an inductive electric field in a direction of a center axis of the cylindrical dielectric discharge tube. However, if the antenna is applied with a high voltage, the antenna may produce capacitively-coupled plasma to heat the dielectric tube. Accordingly, a novel inductive coil structure is required to prevent high voltage from being applied to the antenna.

In the first inductive coil structure 110, the inductive electric field may depend on the driving frequency and a current (or the number of turns per unit length). Also, the highest voltage to be applied to the first inductive coil structure 110 may be determined depending on the total impedance and current of the first inductive coil structure 110. Impedance of the first inductive coil structure 110 may depend on the inductance and the driving frequency of the first inductive coil structure 110. Accordingly, if the inductance of the first inductive coil structure is increased to reduce the highest voltage to be applied to the first inductive coil structure, the inductive electric field may have an increased strength, but a capacitive coupling effect may be increased by the highest voltage. Thus, to reduce the impedance of the first inductive coil structure, the first inductive coil structure 10 may include a plurality of inductive coils 112, 114, 116, and 118 and a plurality of auxiliary capacitors 113, 115, and 117, each of which is interposed between adjacent ones of the inductive coils. Furthermore, the inductive coil and the auxiliary capacitor adjacent thereto may be connected in series to each other to form a series resonance circuit. The inductive coils and the auxiliary capacitors may be electrically and alternately arranged and may be connected in series to each other. Accordingly, the first inductive coil structure may provide an overall low impedance. The number of the auxiliary capacitors may be less by one than the number of the inductive coils.

In addition, the first inductive coil structure 110 may constitute a perfect resonance circuit overall. For this, the first main capacitor 121 may be connected to one end of the first inductive coil structure 110, and the second main capacitor 122 may be connected to an opposite end of the first inductive coil structure 110. To realize the perfect resonance circuit, capacitance C2 of the first main capacitor 121 may be two times capacitance C1 of the auxiliary capacitor (i.e., C2=2C1).

If such a resonance circuit is configured, the highest voltage to be applied to the first inductive coil structure 110 may be inversely proportional to the number of the inductive coils.

The first inductive coil structure 110 may include inductive coils 112, 114, 116, and 118, which are connected in series to each other and are placed at different layers, and auxiliary capacitors 113 and 115, which are respectively provided between adjacent ones of the inductive coils to distribute a voltage applied to the inductive coils. The inductive coils 112, 114, 116, and 118 may be provided to have at least one turn at each layer.

The inductive coils may include first to fourth inductive coils 112, 114, 116, and 118. The auxiliary capacitor may include first to third auxiliary capacitors 113, 115, and 117. All of the first to fourth inductive coils 112, 114, 116, and 118 may have the same inductance of L1. All of the first to third auxiliary capacitors 113, 115, and 117 may have the same capacitance of C1. Each of the first to third auxiliary capacitors 113, 115, and 117 may have 2C1 and thus it may be depicted as a pair of serially-connected imaginary capacitors. Accordingly, the first main capacitor 121, the first inductive coil 112, and the imaginary capacitor may constitute a resonance circuit, thereby reducing the voltage overall.

When compared with the case in which the auxiliary capacitors 113, 115, and 117 are not provided, if the auxiliary capacitors are provided, the voltage may be decreased in inverse proportion to the number of the inductive coil. Nevertheless, the overall number of turns per unit length in the dielectric tube may be maintained. To meet such a resonance condition, the driving frequency may be controlled to coincide with the resonance frequency.

In addition, to increase the number of turns per unit length in the dielectric tube and thereby to increase the strength of the inductive electric field, each of the inductive coils 112, 114, 116, and 118 may be a 3-turn coil or a 4-turn coil. The inductive coils 112, 114, 116, and 118 may be vertically stacked with a sufficiently small distance, and a space for electric connection may be required. To satisfy this requirement, each inductive coil may not have a portion jumping an arrangement plane, and input and output terminals of each inductive coil should not be placed at a mutually-stacked position. For this, the inductive coil having the following structure is proposed.

The inductive coils 112, 114, 116, and 118 may include first to fourth inductive coils 112, 114, 116, and 118, which are sequentially stacked. The auxiliary capacitors 113, 115, and 117 may include first to third auxiliary capacitors 113, 115, and 117.

The auxiliary capacitor between each pair of the inductive coils may be configured to reverse the electric potential. In other words, on the same arrangement plane, a turn (or a first circular arc portion) close to the dielectric tube and the farthest turn (or a fourth circular arc portion) may be induced to have electric potentials opposite to each other. In the dielectric tube, the electric potential of the inductive coil may be canceled, and thus, an electrostatic electric field toward the dielectric tube by a capacitive-coupling may not occur. This reduction of the electrostatic electric field may reduce a capacitive coupling effect.

In a conventional structure, inductance may cause a large potential difference at both ends of an antenna, and the large potential difference may result in ion acceleration, energy loss, and heating and damage of the dielectric tube. By contrast, in the case where the auxiliary capacitor is provided between the inductive coils, a potential difference may be reduced and the electric potential may have opposite signs at internal and outer regions of each inductive coil. The electric potentials having opposite signs may act as a dipole field in the dielectric tube, thereby reducing an electrostatic electric field. Each of the inductive coils 112, 114, 116, and 118 may include a plurality of winding wires, which are wound outward on the same plane.

The first inductive coil 112 may be provided to surround the dielectric tube. When compared with the first inductive coil 112, the second inductive coil 114 may be rotated counterclockwise by 90° and may be placed below and aligned with the first inductive coil 112. When compared with the second inductive coil 114, the third inductive coil 116 may be rotated counterclockwise by 90° and may be placed below and aligned with the second inductive coil 114. When compared with the third inductive coil 116, the fourth inductive coil 118 may be rotated counterclockwise by 90° and may be placed below and aligned with the third inductive coil 116. One end of the first inductive coil 112 may be connected to the positive output terminal of the RF power supply 140 through the first main capacitor 121. An opposite end of the first inductive coil 112 may be connected to one end of the second inductive coil 114 through the first auxiliary capacitor 113. An opposite end of the second inductive coil 114 may be connected to one end of the third inductive coil 116 through the second auxiliary capacitor 115. An opposite end of the third inductive coil 116 may be connected to one end of the fourth inductive coil 118 through the third auxiliary capacitor 117. An opposite end of the fourth inductive coil 118 may be connected to the negative output terminal of the RF power supply 140 through the second main capacitor 122. To maintain the azimuthal symmetry, each of the first to fourth inductive coils may be rotated by 90°, when it is stacked on another.

A voltage (e.g., 2V) of the innermost winding wire of each of inductive coils may have a phase opposite to a voltage (e.g., −2V) of the outermost winding wire. In addition, the innermost winding wires of all inductive coils may have the same voltage. Accordingly, parasitic capacitance between adjacent ones of the inductive coils may be reduced and a discharge property may be improved. In addition, since plasma in the dielectric tube is affected by the same voltage of the inner winding wires, a local ion sputtering may be reduced.

The inductive coil may be divided into a plurality of inductive coils, and auxiliary capacitors may be interposed between the divided inductive coils to reduce the highest voltage. However, to provide a sufficiently high inductive electric field, it is necessary to increase the number of turns per unit length. To increase the number of turns per unit length, the number of turns in each of the inductive coils 112, 114, 116, and 118 may be increased. However, it is necessary to dispose each inductive coil on the same arrangement plane. If each inductive coil has a wiring portion that is not positioned on the arrangement plane, it may cause a difficult in densely stacking other inductive coils disposed on an adjacent layer. Each inductive coil may have 3 or 4 turns on the same arrangement plane.

In certain embodiments, the winding number of each inductive coil may be configured to have five or more turns.

Each of the inductive coils 112, 114, 116, and 118 may include a first circular arc portion 22a, which has a portion opened in a first or x-axis direction in a rectangular coordinate system and is provided on an arrangement plane to have a first central angle and a constant first radius; a second circular arc portion 22b, which is provided on the arrangement plane to have a second central angle less than the first central angle, to have a second radius larger than the first radius, and to have the same center axis as a center axis of the first circular arc portion; a third circular arc portion 22c, which is provided on the arrangement plane to have a third central angle less than the second central angle, to have a third radius larger than the second radius, and to have the same center axis as the center axis of the first circular arc portion; a fourth circular arc portion 22d, which is provided on the arrangement plane to have a fourth central angle less than the third central angle, to have a fourth radius larger than the third radius, and to have the same center axis as the center axis of the first circular arc portion; a first connecting portion 23a, which is provided on the arrangement plane to be connected to one end of the first circular arc portion 22a and to extend in the first or x-axis direction; a "U"-shaped first circular arc connecting portion 24a, which is provided on the arrangement plane to connect an opposite end of the first circular arc portion 22a with one end of the second circular arc portion 22b; a "U"-shaped second circular arc connecting portion 24b, which is provided on the arrangement plane to connect an opposite end of the second circular arc portion to one end of the third circular arc portion; a "U"-shaped third circular arc connecting portion 24c, which is provided on the arrangement plane to connect an opposite end of the third circular arc portion to one end of the fourth circular arc portion; and a second connecting portion 23b, which is provided on the arrangement plane to be connected to an opposite end of the fourth circular arc portion 22d and to extend in the first direction. The fourth central angle may be equal to or greater than 270°. The first circular arc connecting portion 24a, the second circular arc connecting portion 24b, and the third circular arc connecting portion 24c may be provided in such a way that they are not overlapped with each other. The first circular arc connecting portion 24a may be provided in a region defined by the second circular arc connecting portion 24b.

In each of the inductive coils 112, 114, 116, and 118, a space between winding wires (e.g., the first to fourth circular arc portions) may be uniform. For example, the space may range from 1 mm to 3 mm. To allow the inductive coil to have sufficient azimuthal symmetry, the first to fourth central angles may be equal to or greater than 270°. To suppress occurrence of arc discharge at atmospheric pressure by a voltage difference, the first to fourth circular arc portions may be spaced apart from each other by a sufficiently large distance of several mm or larger.

Inductive coils provided at adjacent layers may be electrically disconnected from each other by an insulating spacer 150. The insulating spacer 150 may be provided in the form of a washer (e.g., a thin circular plate with central penetration hole) and may be inserted to enclose an outer side surface of the dielectric tube 130. The insulating spacer 150 may be glass, plastic, or Teflon. A thickness of the insulating spacer 150 may be of the order of several mm. An inner radius of the insulating spacer 150 may be substantially equal to the outer radius of the dielectric tube 130, and an outer radius of the insulating spacer 150 may be substantially equal to an outermost radius of the inductive coil. A distance between inner and outer radii of the insulating spacer 150 may range from several to several tens of cm.

In some embodiments, at least a portion of the inductive coils 112, 114, 116, and 118 may be molded by a ceramic paste. A ceramic mold 152 encapsulating at least a portion of the inductive coil may be in thermal contact with the dielectric tube 130. Accordingly, in the case where there is refrigerant flowing in the inductive coils 112, 114, 116, and 118, the inductive coil may refrigerate the ceramic mold 152, and the ceramic mold 152 may refrigerate indirectly the dielectric tube 130.

Each of the inductive coils 112, 114, 116, and 118 may be provided to be outward wound around the dielectric tube four times at each layer. A pair of inductive coils placed at adjacent layers may be connected in series to each other by an auxiliary capacitor therebetween. The auxiliary capacitor may be provided to have capacitance canceling the inductance of the inductive coil. Four inductive coils may constitute one group. The four inductive coils may be arranged in such a way that each of them is rotated counterclockwise by 90° with respect to a previous one.

Both ends of the dielectric tube may be sealed by a flange. An upper flange 132 may fasten one end of the dielectric tube and may include a nozzle 131 supplying a mixture gas of hydrogen and nitrogen. The inductive coils 112, 114, 116, and 118 enclosing a center portion the dielectric tube may generate ICP in the dielectric tube. A lower flange 134 may fasten an opposite end of the dielectric tube, and gas, which can be additionally decomposed by the ICP, may be provided to the opposite end of the dielectric tube.

Figure 3A:
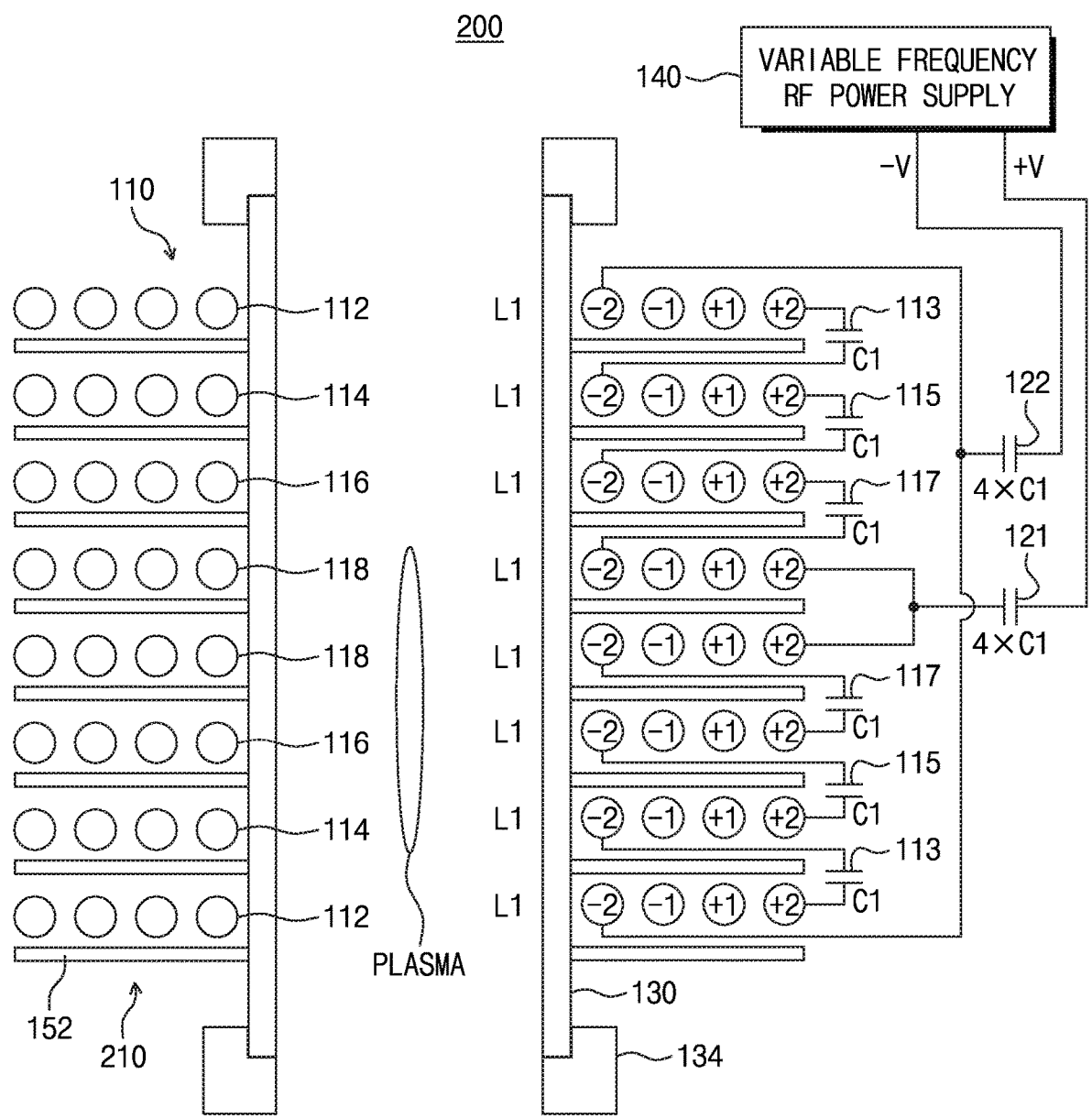
FIG. 3A is a conceptual diagram illustrating an ICP generation system according to other example embodiments of the inventive concept.

FIG. 3A is a conceptual diagram illustrating an ICP generation system according to other example embodiments of the inventive concept.

Figure 3B:
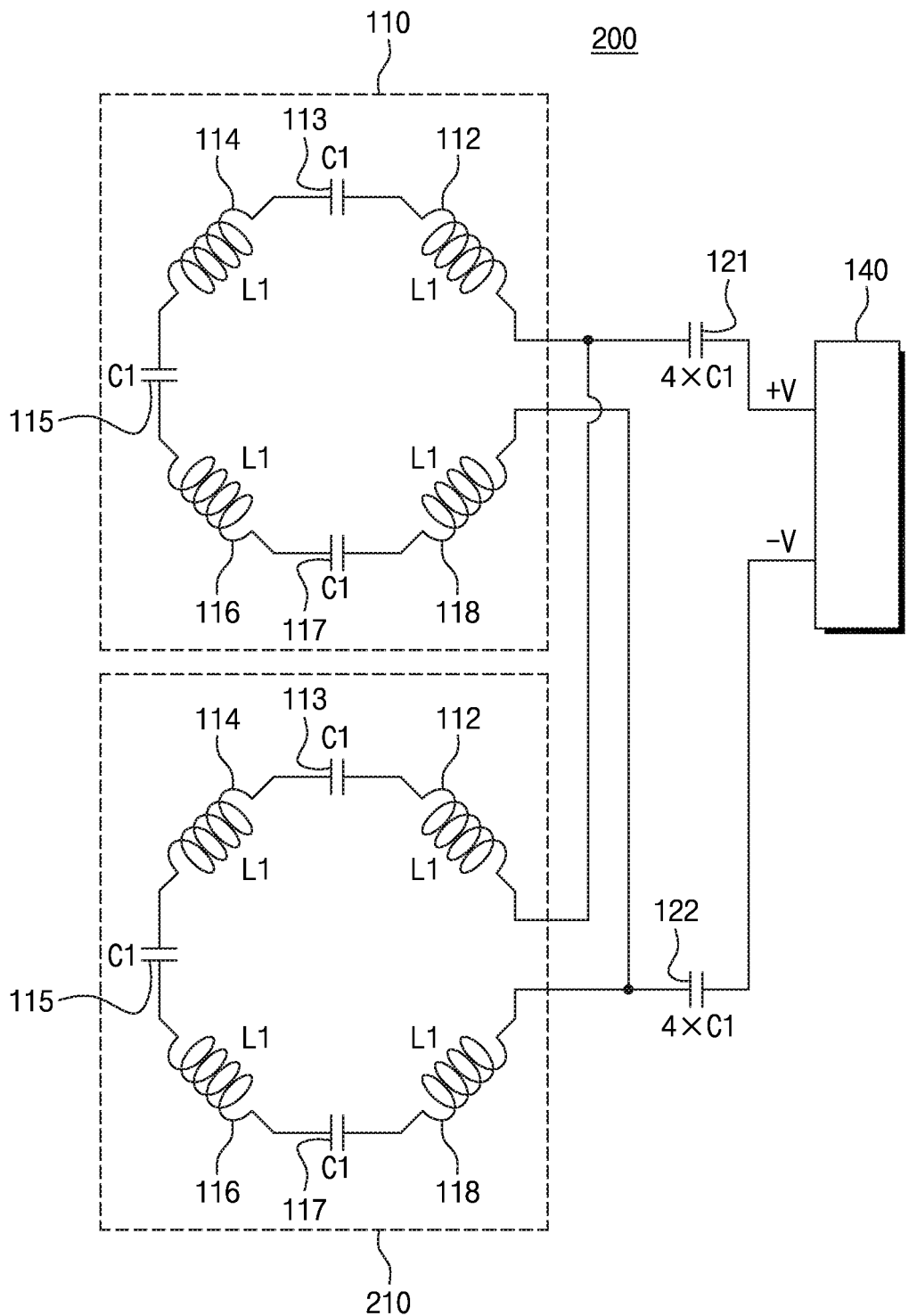
FIG. 3B is a circuit diagram illustrating the ICP generation system of FIG. 3A.

FIG. 3B is a circuit diagram illustrating the ICP generation system of FIG. 3A.

Figure 3C:
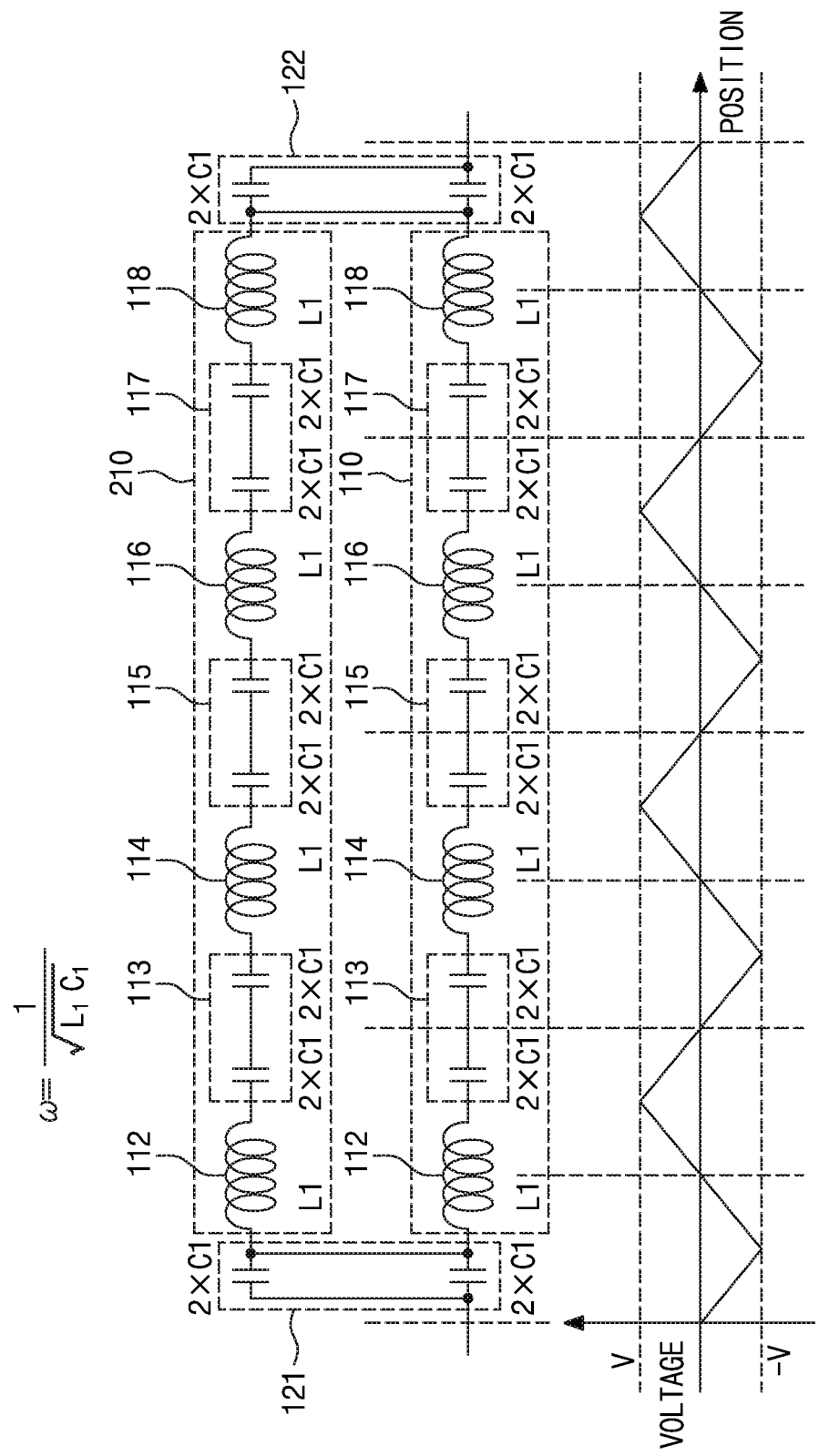
FIG. 3C is a diagram illustrating a voltage division in an inductive coil structure of the ICP generation system of FIG. 3A.

FIG. 3C is a diagram illustrating a voltage division in an inductive coil structure of the ICP generation system of FIG. 3A.

Referring to FIGS. 3A through 3C, an ICP generation system 200 may include a dielectric tube 130 extending in a length direction; a first inductive coil structure 110, which is provided to enclose the dielectric tube 130 and to produce ICP in the dielectric tube 130; an RF power supply 140, which is configured to provide positive and negative powers having opposite phases, to respectively supply positive and negative powers of RF power to both ends of the first inductive coil structure, and to change a driving frequency; a first main capacitor 121 provided between a positive output terminal of the RF power supply and one end of the first inductive coil structure; and a second main capacitor 122 provided between a negative output terminal of the RF power supply and an opposite end of the first inductive coil structure.

A second inductive coil structure 210 may be provided to surround the dielectric tube 130 and may be spaced apart from the first inductive coil structure 110 in the length direction. The second inductive coil structure 210 may have the same structure as the first inductive coil structure 110 and may be used to generate ICP in the dielectric tube 130.

One end of the second inductive coil structure 210 may be connected to the one end of the first inductive coil structure 110, and an opposite end of the second inductive coil structure 210 may be connected to the opposite end of the first inductive coil structure 110. The first inductive coil structure 110 and the second inductive coil structure 210 may be connected in parallel to each other, between the first main capacitor 121 and the second main capacitor 122.

Each of the inductive coils 112, 114, 116, and 118 constituting the first inductive coil structure 110 and the second inductive coil structure 210 may have the same inductance (e.g., of first inductance L1). Each of the auxiliary capacitors 113, 115, and 117 constituting the first inductive coil structure 110 and the second inductive coil structure 210 may have the same capacitance of first capacitance C1. A driving frequency of the RF power supply 140 may be controlled to coincide with a resonance frequency, which is determined by the first inductance L1 and the first capacitance C1 connected in series to each other.

The first main capacitor and the second main capacitor may have the same capacitance (e.g., of second capacitance C2), and the second capacitance C2 may be four times the first capacitance C1.

The one end of the first inductive coil structure 110 may be disposed adjacent to the one end of the second inductive coil structure 210. The one end of the first inductive coil structure and the one end of the second inductive coil structure may be connected to each other and may be connected to the first main capacitor 121. The opposite end of the first inductive coil structure 110 and the opposite end of the second inductive coil structure 210 may be connected to each other and may be connected to the second main capacitor.

The first inductive coil structure 110 and the second inductive coil structure 210 may be provided to have a vertical mirror symmetry with reference to a point of the dielectric discharge tube 130. Current may be vertically divided at a center and then may be collected at both ends.

In addition, the first inductive coil structure 110 and the second inductive coil structure 210 may constitute a perfect resonance circuit overall. For this, the first main capacitor 121 may be connected to the one end of the first inductive coil structure 110 and the one end of the second inductive coil structure 210. The second main capacitor 122 may be connected to the opposite end of the first inductive coil structure 110 and the opposite end of the second inductive coil structure 210. To realize the perfect resonance circuit, capacitance C2 of the first main capacitor 121 may be four times capacitance C1 of the auxiliary capacitor (i.e., C2=4C1). The first main capacitor may be depicted as a parallel-connected capacitor and may have 2C1.

The inductive coils may include first to fourth inductive coils 112, 114, 116, and 118. The auxiliary capacitor may include first to third auxiliary capacitors 113, 115, and 117. All of the first to fourth inductive coils 112, 114, 116, and 118 may have the same inductance of L1. All of the first to third auxiliary capacitors 113, 115, and 117 may have the same capacitance of C1. Each of the first to third auxiliary capacitors 113, 115, and 117 may be depicted as a pair of serially-connected imaginary capacitors and may have 2C1. Accordingly, a portion (2C1) of the first main capacitor 121, the first inductive coil 112, and the imaginary capacitor (2C1) ma y constitute a resonance circuit, thereby reducing the voltage overall.

The first inductive coil structure 110 and the second inductive coil structure 210 may be connected in parallel to each other, and thus, the ICP generation system 200 may include eight inductive coils. The inductive coils of the first inductive coil structure ma y be sequentially arranged in such a way that each of them is rotated counterclockwise by 90° with respect to a previous one. The inductive coils of the second inductive coil structure may be sequentially arranged in such a way that each of them is rotated clockwise by 90° with respect to a previous one.

The auxiliary capacitor may be provided to cancel an imaginary part of impedance between the inductive coils. Both ends of two groups (i.e., the first and second inductive coil structures), each of which includes four serially-connected inductive coils, may be connected in parallel to each other and then may be electrically connected to an outer terminal.

The auxiliary capacitor between each pair of the inductive coils may be configured to reverse the electric potential. In other words, on the same arrangement plane, the innermost turn (or a first circular arc portion) close to the dielectric tube and the outermost turn (or a fourth circular arc portion) may be induced to have electric potentials opposite to each other. In the dielectric tube, the electric potential of the inductive coil may be canceled, and thus, an electrostatic electric field toward the dielectric tube by a capacitive-coupling may not occur. This reduction of the electrostatic electric field may reduce a capacitive coupling effect.

In a conventional structure, inductance may cause a large potential difference at both ends of an antenna, and the large potential difference may result in ion acceleration, energy loss, and heating and damage of the dielectric tube. By contrast, in the case where the auxiliary capacitor is provided between the inductive coils, a potential difference may be reduced and the electric potential may have opposite signs at internal and outer regions of each inductive coil. The electric potentials having opposite signs may act as a dipole field in the dielectric tube, thereby reducing an electrostatic electric field.

Figure 4A:
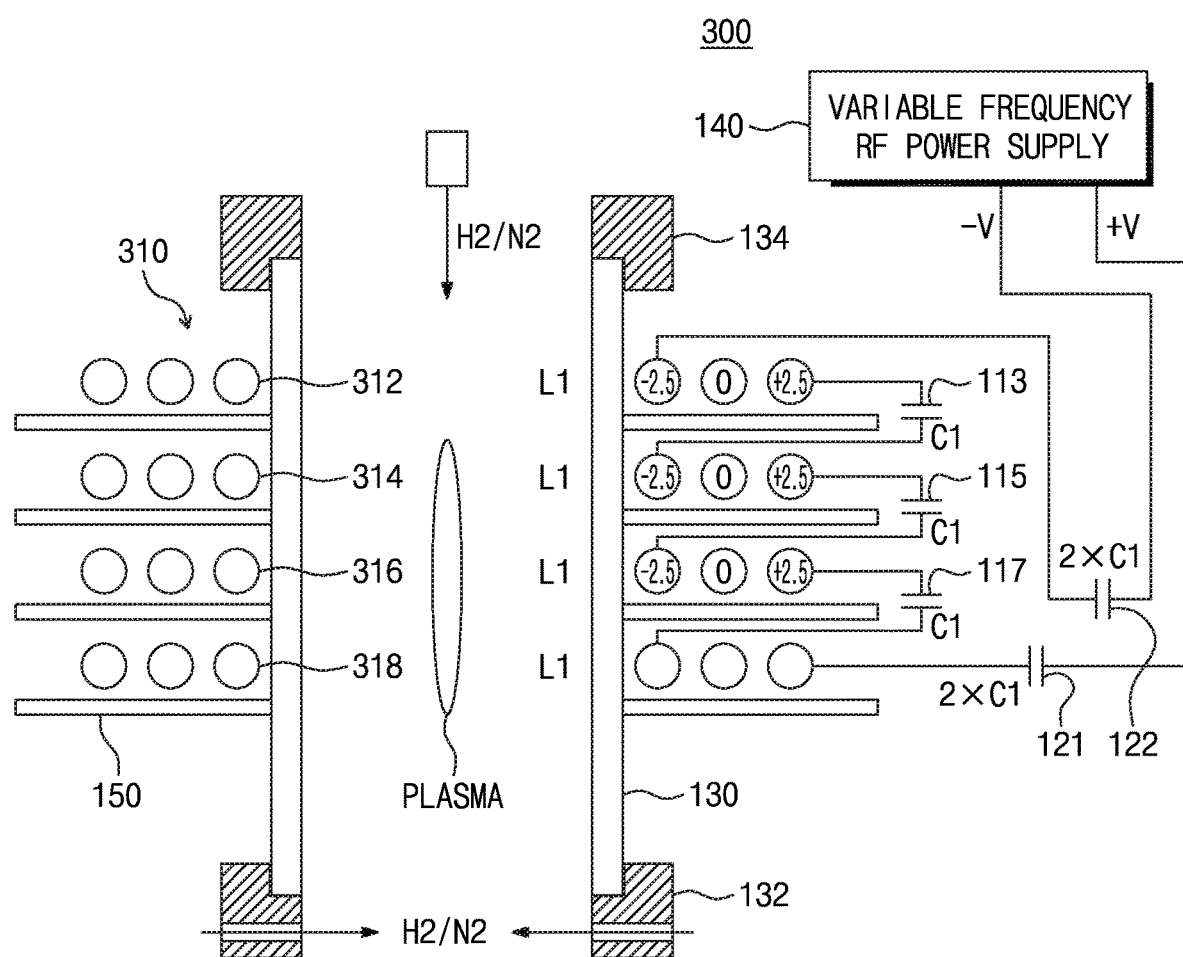
FIG. 4A is a conceptual diagram illustrating an ICP generation system according to still other example embodiments of the inventive concept.

FIG. 4A is a conceptual diagram illustrating an ICP generation system according to still other example embodiments of the inventive concept.

Figure 4B:
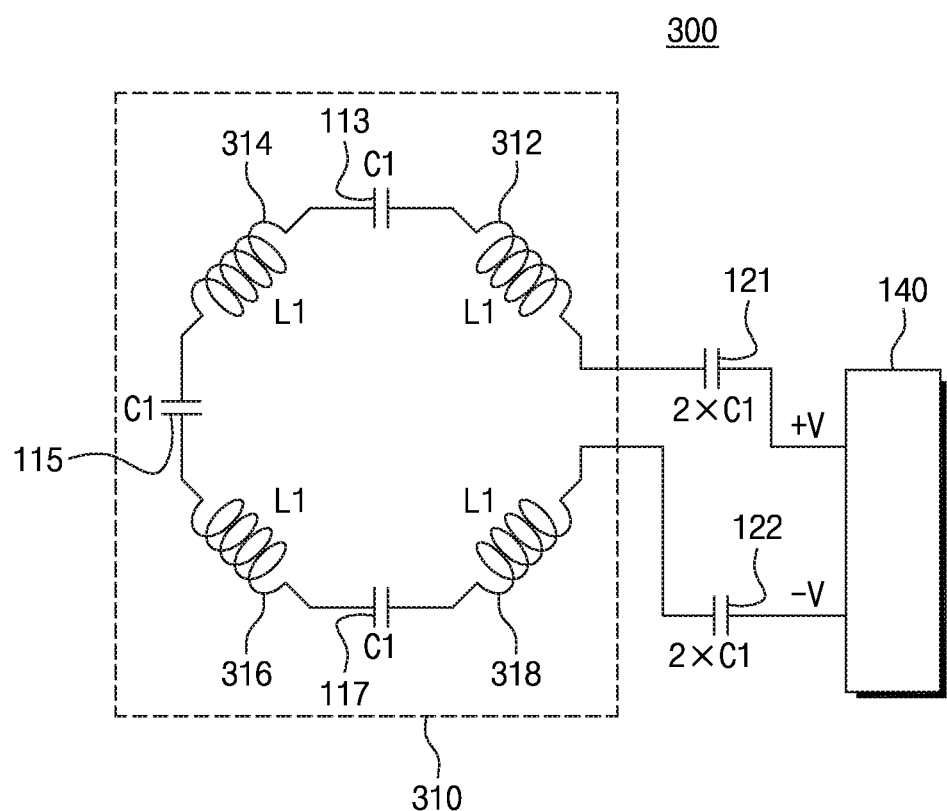
FIG. 4B is a circuit diagram illustrating the ICP generation system of FIG. 4A.

FIG. 4B is a circuit diagram illustrating the ICP generation system of FIG. 4A.

Figure 4C:
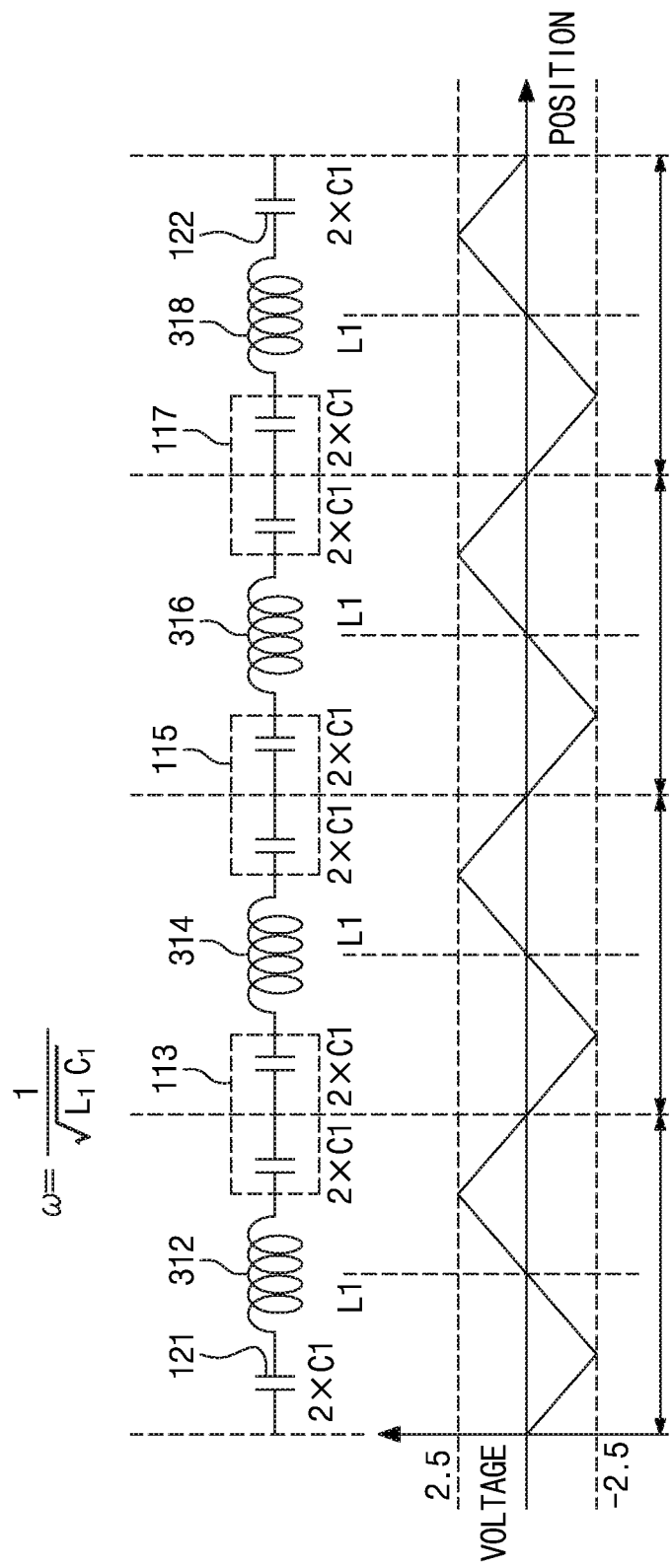
FIG. 4C is a diagram illustrating voltage division in an inductive coil structure of the ICP generation system of FIG. 4A.

FIG. 4C is a diagram illustrating voltage division in an inductive coil structure of the ICP generation system of FIG. 4A.

Figure 4D:
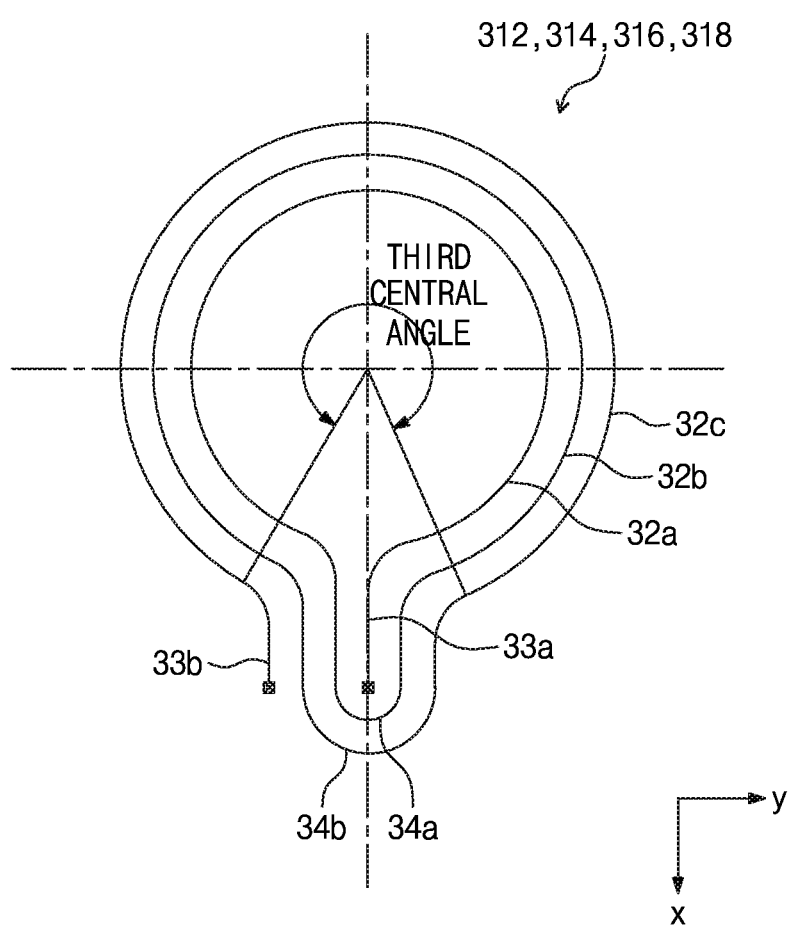
FIG. 4D is a plan view illustrating an inductive coil of the ICP generation system of FIG. 4A.

FIG. 4D is a plan view illustrating an inductive coil of the ICP generation system of FIG. 4A.

Referring to FIGS. 4A through 4D, an ICP generation system 300 may include a dielectric tube 130 extending in a length direction; a first inductive coil structure 310, which is provided to enclose the dielectric tube 130 and to produce ICP in the dielectric tube 130; an RF power supply 140, which is configured to provide positive and negative powers having opposite phases, to respectively supply positive and negative powers of RF power to both ends of the first inductive coil structure, and to change a driving frequency; a first main capacitor 121 provided between a positive output terminal of the RF power supply and one end of the first inductive coil structure; and a second main capacitor 122 provided between a negative output terminal of the RF power supply and an opposite end of the first inductive coil structure.

The first main capacitor 121 and the second main capacitor 122 may have the same capacitance (e.g., of second capacitance C2), and the second capacitance C2 may be two times the first capacitance C1 of the auxiliary capacitor.

Inductive coils may include first to fourth inductive coils 312, 314, 316, and 318. The auxiliary capacitor may include first to third auxiliary capacitors 113, 115, and 117. All of the first to fourth inductive coils 312, 314, 316, and 318 may have the same inductance of L1. All of the first to third auxiliary capacitors 113, 115, and 117 may have the same capacitance of C1. Each of the first to third auxiliary capacitors 113, 115, and 117 may be depicted as a pair of serially-connected imaginary capacitors and may have 2C1. Accordingly, a portion (2C1) of the first main capacitor 121, the first inductive coil 312, and the imaginary capacitor (2C1) may constitute a resonance circuit, thereby reducing the voltage overall.

Each of the inductive coils 312, 314, 316, and 318 may include a first circular arc portion 32a, which has a portion opened in a first or x-axis direction in a rectangular coordinate system and is provided on an arrangement plane to have a first central angle and a constant first radius; a second circular arc portion 32b, which is provided on the arrangement plane to have a second central angle less than the first central angle, to have a second radius larger than the first radius, and to have the same center axis as a center axis of the first circular arc portion; a third circular arc portion 32c, which is provided on the arrangement plane to have a third central angle less than the second central angle, to have a third radius larger than the second radius, and to have the same center axis as the center axis of the first circular arc portion; a first connecting portion 33a, which is provided on the arrangement plane to be connected to one end of the first circular arc portion and to extend in the first direction; a "U"-shaped first circular arc connecting portion 34a, which is provided on the arrangement plane to connect an opposite end of the first circular arc portion to one end of the second circular arc portion; a "U"-shaped second circular arc connecting portion 34b, which is provided on the arrangement plane to connect an opposite end of the second circular arc portion to one end of the third circular arc portion; and a second connecting portion 33b, which is provided on the arrangement plane to be connected to an opposite end of the third circular arc portion and to extend in the first direction. The third central angle may be equal to or greater than 270.

Figure 5A:
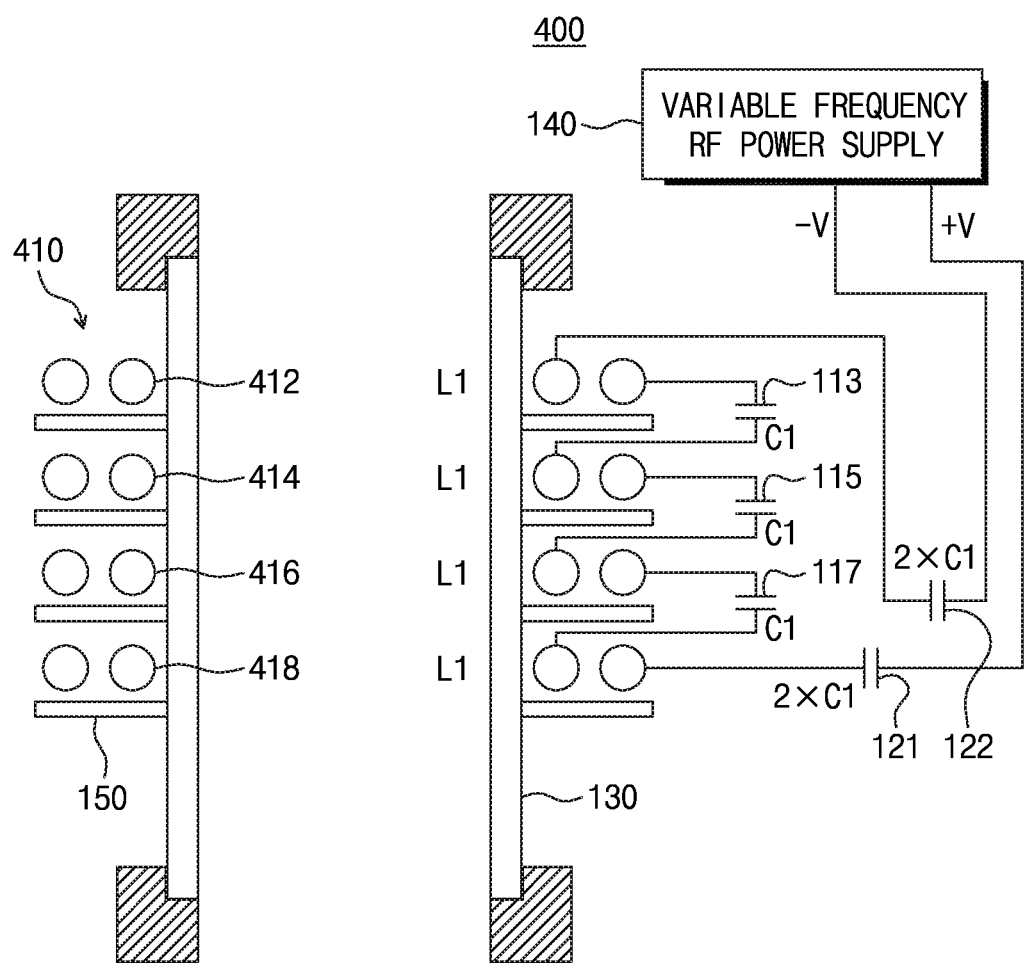
FIG. 5A is a conceptual diagram illustrating an ICP generation system according to even other example embodiments of the inventive concept.

FIG. 5A is a conceptual diagram illustrating an ICP generation system according to even other example embodiments of the inventive concept.

Figure 5B:
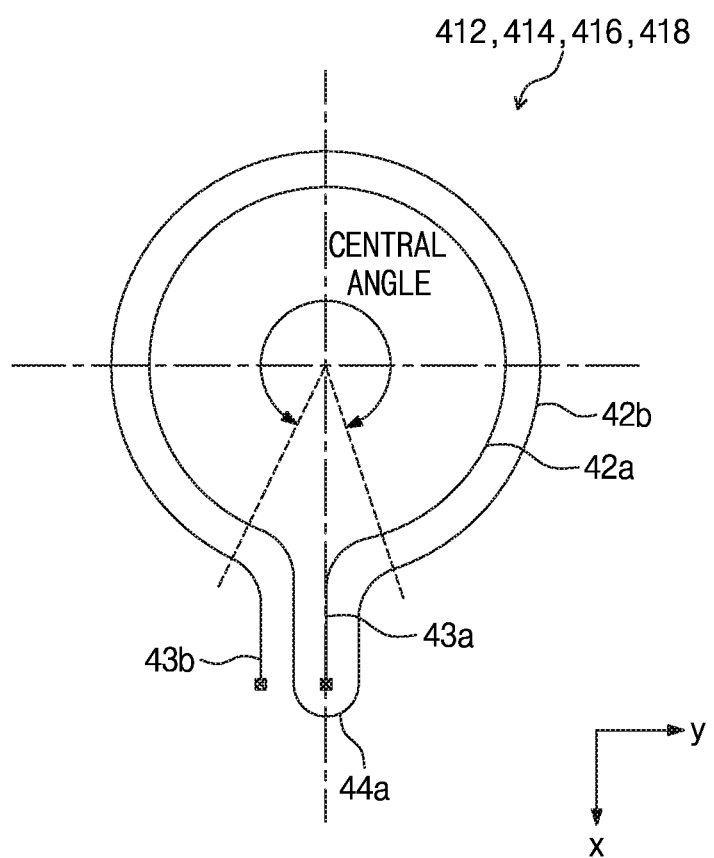
FIG. 5B is a plan view illustrating an inductive coil of the ICP generation system of FIG. 5A.

FIG. 5B is a plan view illustrating an inductive coil of the ICP generation system of FIG. 5A.

Referring to FIGS. 5A and 5B, an ICP generation system 400 may include a dielectric tube 130 extending in a length direction; a first inductive coil structure 410, which is provided to enclose the dielectric tube 130 and to produce ICP in the dielectric tube 130; an RF power supply 140, which is configured to provide positive and negative powers having opposite phases, to respectively supply positive and negative powers of RF power to both ends of the first inductive coil structure, and to change a driving frequency; a first main capacitor 121 provided between a positive output terminal of the RF power supply and one end of the first inductive coil structure; and a second main capacitor 122 provided between a negative output terminal of the RF power supply and an opposite end of the first inductive coil structure.

The first main capacitor 121 and the second main capacitor 122 may have the same capacitance (e.g., of second capacitance C2), and the second capacitance C2 may be two times the first capacitance C1 of the auxiliary capacitor.

Inductive coils may include first to fourth inductive coils 412, 414, 416, and 418. The auxiliary capacitor may include first to third auxiliary capacitors 113, 115, and 117. All of the first to fourth inductive coils 412, 414, 416, and 418 may have the same inductance of L1. All of the first to third auxiliary capacitors 113, 115, and 117 may have the same capacitance of C1. Each of the first to third auxiliary capacitors 113, 115, and 117 may be depicted as a pair of serially-connected imaginary capacitors and may have 2C1. Accordingly, a portion (2C1) of the first main capacitor 121, the first inductive coil 412, and the imaginary capacitor (2C1) may constitute a resonance circuit, thereby reducing the voltage overall.

Each of the inductive coils 412, 414, 416, and 418 may include a first circular arc portion 42a, which has a portion opened in a first direction in a rectangular coordinate system and is provided on an arrangement plane to have a first central angle and a constant first radius; a second circular arc portion 42b, which is provided on the arrangement plane to have a second central angle less than the first central angle, to have a second radius larger than the first radius, and to have the same center axis as a center axis of the first circular arc portion; a first connecting portion 43a, which is provided on the arrangement plane to be connected to one end of the first circular arc portion and to extend in the first direction; a "U"-shaped first circular arc connecting portion 44a, which is provided on the arrangement plane to connect an opposite end of the first circular arc portion to one end of the second circular arc portion; and a second connecting portion 43b, which is provided on the arrangement plane to be connected to an opposite end of the second circular arc portion and to extend in the first direction. The second central angle may be equal to or greater than 270.

According to some embodiments of the inventive concept, a plasma generation system may include an inductive coil structure, which is configured to suppress a capacitive coupling effect and to stably and efficiently generate ICP.

According to some embodiments of the inventive concept, an auxiliary capacitor is provided to serially connect inductive coils, which constitute an inductive coil structure of a plasma generation system, to each other, and this makes it possible to distribute a voltage and to reduce the overall highest voltage.

According to some embodiments of the inventive concept, a plasma generation system is configured to have the same electric potential at positions, where each of inductive coils constituting an inductive coil structure is in contact with a dielectric tube, and thus, it may be possible to suppress occurrence of a parasitic capacitor, to improve discharge stability, and to suppress a local ion sputtering.

While example embodiments of the inventive concepts have been particularly shown and described, it will be understood by one of ordinary skill in the art that variations in form and detail may be made therein without departing from the spirit and scope of the attached claims.

What is claimed is:

1. An inductively-coupled plasma (ICP) generating device including an inductive coil and a tube, wherein:
   the inductive coil comprises:
   a first unit antenna including a first end, a second end and a first circular arc between the first end and the second end and wound around the tube;
   a second unit antenna which is located at a predetermined distance from the first unit antenna in a direction of length of the tube and includes a third end, a fourth end and a second circular arc between the third end and the fourth end, and wound around the tube; and
   a first capacitor which is connected between the second end and the third end and has a first capacitance;
   wherein,
   the first unit antenna and the second unit antenna have a first inductance, and
   the inductive coil resonates at a first frequency which is determined based on the first inductance and the first capacitance.

2. The inductively-coupled plasma (ICP) generating device of the claim 1, wherein:
   the first end is extended in a first direction from one end of the first circular arc and the second end is extended in a second direction from the other end of the first circular arc, and
   the first direction and the second direction are perpendicular to the direction of the length of the tube.

3. The inductively-coupled plasma (ICP) generating device of the claim 2, wherein:
   the second direction is a direction which is rotated from the first direction by a predetermined angle in a circumferential direction of the tube about the central axis of the tube, in the view of the direction of the length of the tube.

4. The inductively-coupled plasma (ICP) generating device of the claim 1, wherein:
   the first end is located at a position spaced apart from the second end by a first angle in a circumferential direction of the tube about a central axis of the tube, in the view of the direction of the length of the tube, and
   the fourth end is located at a position spaced apart from the third end by the first angle in the circumferential direction of the tube about the central axis of the tube, in the view of the direction of the length of the tube.

5. The inductively-coupled plasma (ICP) generating device of the claim 4, wherein:
   the third end is located at a position spaced apart from the second end by a second angle in the circumferential direction of the tube about the central axis of the tube, in the view of the direction of the length of the tube, and
   the second angle is larger than the first angle.

6. The inductively-coupled plasma (ICP) generating device of the claim 1, wherein:
   the first unit antenna includes a first opened portion between the first end and the second end which is opened to a first direction, and
   the second unit antenna includes a second opened portion between the third end and the fourth end which is opened to a second direction.

7. The inductively-coupled plasma (ICP) generating device of the claim 6, wherein:
   the second direction is different from the first direction.

8. The inductively-coupled plasma (ICP) generating device of the claim 6, wherein:
   the second direction is opposite to the first direction.

9. The inductively-coupled plasma (ICP) generating device of the claim 6, wherein:
   the second direction is a direction in which the first direction is rotated in a circumferential direction of the tube by a predetermined angle about a center axis of the tube, in the view of the direction of the length of the tube.

10. The inductively-coupled plasma (ICP) generating device of the claim 6, wherein:

the first opened portion has a first central angle in a plane of the first unit antenna about a center of the first circular arc, and the second opened portion has a second central angle which is the same as the first central angle in a plane of the second unit antenna about a center of the second circular arc.

11. The inductively-coupled plasma (ICP) generating device of the claim 1, wherein:

the second unit antenna have a shape corresponding to the first unit antenna.

12. The inductively-coupled plasma (ICP) generating device of the claim 1, wherein:

the first unit antenna is placed around the tube in a first position, and the second unit antenna is placed around the tube in a second position which is the predetermined distance below the first position in the direction of the length of the tube and rotated in a first direction from the first position.

13. The inductively-coupled plasma (ICP) generating device of the claim 12, wherein:

the first direction is a circumferential direction of the tube.

14. The inductively-coupled plasma (ICP) generating device of the claim 1, wherein:

the first unit antenna is placed around the tube so that at least portion of the first circular arc contacts with the tube.

15. The inductively-coupled plasma (ICP) generating device of the claim 1, further comprising:

a second capacitor which has a second capacitance connected with the first end of the inductive coil, wherein the second capacitor enables a maximum voltage value at the first end and a maximum voltage value at the second end correspond to each other.

16. The inductively-coupled plasma (ICP) generating device of the claim 1, wherein:

the first circular arc includes multiple turns including a first turn which is an inner-most turn and a second turn which is an outer-most turn.

17. The inductively-coupled plasma (ICP) generating device of the claim 16, wherein:

the first circular arc is placed around the tube so that at least part of the first turn contact with the tube and at least part of the second circular tube is spaced apart from the tube.

18. The inductively-coupled plasma (ICP) generating device of the claim 16, wherein:

the first turn has a first central angle about a center of the first turn, the second turn has a second central angle which is the same as the first central angle, about the central axis of the tube.

19. The inductively-coupled plasma (ICP) generating device of the claim 16, wherein:

a length of the second turn is larger than a length of the first turn.

20. The inductively-coupled plasma (ICP) generating device of the claim 16, wherein:

the first turn and the second turn are concentric to each other.

* * * * *